US012670570B2

(12) United States Patent (10) Patent No.: US 12,670,570 B2
Korb et al. (45) Date of Patent: Jun. 30, 2026

(54) 3D VOLUME INSPECTION METHOD AND METHOD OF CONFIGURING OF A 3D VOLUME INSPECTION METHOD

(71) Applicant: Carl Zeiss SMT GmbH, Oberkochen (DE)

(72) Inventors: Thomas Korb, Schwaebisch Gmuend (DE); Eugen Foca, Ellwangen (DE); Philipp Huethwohl, Ulm (DE); Dmitry Klochkov, Schwaebisch Gmuend (DE); Jens Timo Neumann, Aalen (DE); Ramani Pichumani, Palo Alto, CA (US); Keumsil Lee, Palo Alto, CA (US)

(73) Assignee: Carl Zeiss SMT GmbH, Oberkochen (DE)

( * ) Notice: Subject to any disclaimer, the term of this patent is extended or adjusted under 35 U.S.C. 154(b) by 497 days.

(21) Appl. No.: 18/172,581

(22) Filed: Feb. 22, 2023

(65) Prior Publication Data

US 2024/0281952 A1 Aug. 22, 2024

(51) Int. Cl.
G06T 7/00 (2017.01)
G01N 23/2251 (2018.01)
(Continued)

(52) U.S. Cl.
CPC ....... G06T 7/0004 (2013.01); G01N 23/2251 (2013.01); H01J 37/1478 (2013.01);
(Continued)

(58) Field of Classification Search
CPC ......... G06T 2207/30148; G06T 7/0004; G06T 2207/10061; G06T 2207/10056;
(Continued)

(56) References Cited

U.S. PATENT DOCUMENTS 8,525,137 B2 * 9/2013 Blackwood .............. G01N 1/06
250/306
10,409,853 B2 * 9/2019 Zheng ................. G06F 16/5846
(Continued)

FOREIGN PATENT DOCUMENTS

WO WO 2020/244795 A1 12/2020
WO WO 2021/083551 A1 5/2021
(Continued)

OTHER PUBLICATIONS

International Search Report and Written Opinion in International PCT/EP2024/051248, mailed on Jul. 5, 2024, 18 pages.
(Continued)

*Primary Examiner* — Sumati Lefkowitz
*Assistant Examiner* — Wayne Zhang
(74) *Attorney, Agent, or Firm* — Fish & Richardson P.C.

(57) ABSTRACT

A method of 3D-inspection of a semiconductor object inside of an inspection volume of a wafer or wafer sample comprises a 3D data processing and a step for acquiring a plurality of two-dimensional images. The acquiring step comprises a monitoring step for determining whether a two-dimensional image is in conformity with a desired property of the 3D data processing. The disclosure further comprises a method of configuring the method of 3D-inspection and a system configured to execute the method of 3D-inspection as well as the method of configuring the method of 3D-inspection.

20 Claims, 11 Drawing Sheets

(51) Int. Cl.

| | |
|---|---|
| *H01J 37/147* | (2006.01) |
| *H01J 37/304* | (2006.01) |
| *H01J 37/305* | (2006.01) |
| *H10P 74/20* | (2026.01) |

(52) U.S. Cl.
CPC ........ *H01J 37/3045* (2013.01); *H01J 37/305* (2013.01); *G01N 2223/401* (2013.01); *G01N 2223/6116* (2013.01); *G06T 2207/20221* (2013.01); *G06T 2207/30148* (2013.01); *G06T 2207/30204* (2013.01); *H01J 2237/30405* (2013.01); *H01J 2237/31749* (2013.01); *H10P 74/203* (2026.01)

(58) Field of Classification Search
CPC . H01L 22/12; H01L 22/10; G01N 2223/6116; G01N 23/2251
See application file for complete search history.

(56) References Cited

U.S. PATENT DOCUMENTS

| | | | | |
|---|---|---|---|---|
| 11,848,172 | B2 | 12/2023 | Klochkov et al. | |
| 12,056,865 | B2 | 8/2024 | Klochkov et al. | |
| 2008/0274722 | A1* | 11/2008 | Kim | H04M 1/7243 455/418 |
| 2009/0252403 | A1* | 10/2009 | Harada | G06T 7/001 382/218 |
| 2010/0243889 | A1* | 9/2010 | Faber | H01J 37/3056 250/306 |
| 2013/0147862 | A1* | 6/2013 | Atkins | G09G 5/008 345/690 |
| 2018/0260940 | A1 | 9/2018 | Langlois et al. | |

| | | | | |
|---|---|---|---|---|
| 2020/0234428 | A1* | 7/2020 | George | G06N 3/082 |
| 2021/0005423 | A1 | 1/2021 | Zeidler | |
| 2022/0138973 | A1 | 5/2022 | Korb et al. | |
| 2022/0392793 | A1 | 12/2022 | Buxbaum et al. | |
| 2023/0145897 | A1 | 5/2023 | Klochkov et al. | |
| 2023/0193035 | A1 | 6/2023 | Clopotel et al. | |
| 2023/0196189 | A1 | 6/2023 | Freytag et al. | |
| 2024/0046446 | A1* | 2/2024 | Vukovic | G06T 7/001 |
| 2024/0331179 | A1 | 10/2024 | Klochkov et al. | |
| 2025/0022680 | A1 | 1/2025 | Klochkov et al. | |
| 2025/0069958 | A1 | 2/2025 | Buxbaum et al. | |
| 2025/0209603 | A1 | 6/2025 | Srikantha et al. | |
| 2025/0362253 | A1 | 11/2025 | Korb et al. | |

FOREIGN PATENT DOCUMENTS

| | | | |
|---|---|---|---|
| WO | WO 2021/083581 A1 | 5/2021 | |
| WO | WO 2021/180600 A1 | 9/2021 | |
| WO | WO 2022/096144 A1 | 5/2022 | |
| WO | WO 2022/223229 A1 | 10/2022 | |
| WO | WO 2023/117238 A1 | 6/2023 | |
| WO | WO 2023/117262 A1 | 6/2023 | |
| WO | WO 2023/117489 A1 | 6/2023 | |
| WO | WO 2023/193947 A1 | 10/2023 | |
| WO | WO 2023/232282 A1 | 12/2023 | |
| WO | WO 2024/061623 A1 | 3/2024 | |
| WO | WO 2024/088923 A1 | 5/2024 | |
| WO | WO 2024/100060 A1 | 5/2024 | |

OTHER PUBLICATIONS

International Search Report and Written Opinion in International PCT/EP2024/053258, May 21, 2024, 15 pages.

\* cited by examiner

3D VOLUME INSPECTION METHOD AND METHOD OF CONFIGURING OF A 3D VOLUME INSPECTION METHOD

FIELD

The present disclosure relates to three-dimensional circuit pattern inspection of semiconductor wafers with a slice-and-image method using a dual beam system. The disclosure can provide an improved method for 3D-volume inspection and a method of configuring an improved 3D-volume inspection method. The disclosure further provides a system for 3D-volume inspection and a system for configuring an improved 3D-volume inspection method.

BACKGROUND

Semiconductor structures are amongst the finest man-made structures and suffer from relatively few imperfections. These rare imperfections are typically the signatures which defect detection or defect review or quantitative metrology devices are looking for. Fabricated semiconductor structures are generally based on prior knowledge, for example from design data and fabricated from a limited number of materials and processes. Furthermore, the semiconductor structures are usually manufactured in a sequence of layers being parallel to the surface of a silicon wafer substrate. For example, in a logic type sample, metal lines are often running parallel in layers and HAR (high aspect ratio) structures or channels and vias run perpendicular to these layers. The angle between metal lines in different layers is typically either 0° or 90°. On the other hand, for 3D NAND type structures it is known that their cross-sections can be circular on average and arranged in a regular raster perpendicular to the surface of a silicon wafer. During manufacturing, a huge number of three-dimensional semiconductor structures is usually generated in a wafer, wherein the fabrication process is subject to several influences. Generally, the edge shapes, areas or overlay positions of semiconductor structures may be subject to the property of involved materials, the lithography exposure, or any other involved manufacturing step, such as etching, polishing, deposition, or implantation.

In the fabrication of integrated circuits, the features size is becoming smaller. The current minimum feature size or critical dimension is below 10 nm, for example 7 nm or 5 nm, and approaching below 3 nm in near future. Recently, even minimum feature sizes of 1 nm have been realized. Therefore, measuring edge shapes of patterns, and to determine the dimensions of structures or the line edge roughness with high precision can become challenging. The measurement resolution of charged particle systems is typically limited by the sampling raster of individual image points or dwell times per pixel on the sample, and the charged particle beam diameter. The sampling raster resolution can be set within the imaging system and can be adapted to the charged particle beam diameter on the sample. The typical raster resolution is generally 2 nm or below, but the raster resolution limit can be reduced with no physical limitation. The charged particle beam diameter has a limited dimension, which generally depends on the selected type of charged particle, the charged particle beam operation conditions and charged particle lens system utilized. The beam resolution is generally limited by approximately half of the beam diameter. The resolution can be below 3 nm, for example below 2 nm, or even below 1 nm.

A common way to generate 3D image data from semiconductor samples on nm scale is the so-called slice and image approach performed for example by a dual beam device. A slice and image approach is described in WO 2020/244795 A1. A slice and image method under a slanted angle is described in WO 2021/180600 A1. According to this method, at least a first inspection site is determined, and 3D volume image of an inspection volume is obtained by slicing and imaging a plurality of cross-section surfaces of the inspection volume. An inspection task may comprise a determination of a property of a dedicated semiconductor object of interest, a determination of a property of a plurality of semiconductor object of interest, for example an average property, an alignment or overlay property, or the like. In an example, the task of the 3D volume inspection is to determine a set of specific parameters of high aspect ratio (HAR)—structures inside the 3D inspection volume with high precision. Depending on the inspection task and a specification of an inspection task, different numbers of cross-section surface under equal or different angles have to be milled and the digital image segments have to be selected, obtained and analyzed. For example, large number N of cross-section surfaces of the inspection volume is generated, with the number N exceeding 100 or even more averaged image slices. For example, in a volume with a lateral dimension of 5 µm and a slicing distance of 5 nm, 1000 slices are milled and imaged. According to a typical 3D volume inspection task, a high accuracy and a highest possible throughput can be involved. For the alignment and registration of the cross-section image slices, different methods have been proposed. For example, reference marks or so-called fiducials can be employed, or a feature-based alignment can be employed.

Many different methods or workflows for 3D-volume inspection have been proposed or developed. However, with certain known approaches, a configuration of a 3D volume inspection workflow can be a comprehensive task, which can involve comprehensive experimentation and deep expert knowledge. Therefore, the application of 3D volume inspection was generally limited to an expert environment.

SUMMARY

There is a demand for workflow architectures, workflow generation and configuration for 3D volume inspection of wafers. The disclosure seeks to provide an improved workflow architecture for 3D volume inspection with a dual beam device. The disclosure seeks to provide a method of generating and configuring of workflows for 3D volume inspection with a dual beam device which makes 3D volume inspection more accessible to a routine environment. The disclosure seeks to provide robust workflows for 3D volume inspection with a dual beam device for automated execution within a routine environment.

According to a first aspect, the disclosure provides a method of 3D volume inspection of semiconductor wafers or wafer samples, which comprises a first step P1 for acquiring a plurality of two-dimensional images from an inspection volume of a semiconductor object according to a predetermined specification and a second, 3D data processing step P2. The first step P1 comprises at least one monitoring sub-step comprising evaluating at least one two-dimensional image from the plurality of two-dimensional images and determining whether the at least one two-dimensional image is in conformity with the predetermined specification. The method of 3D volume inspection therefore can allow for a modular and self-consistent performance of a 3D volume inspection task.

In an example, a workflow comprises 2D-processing modules configured to normalize and convert the input data of a specific measurement instrument into a standardized 2D-image dataset. Thereby, the sequence of processing modules can be agnostic to an image acquisition device. 2D-processing modules for normalizing and conversion can be specific to a geometry of a slice-and image acquisition or a specific for a charged particle beam microscope (CPBM) for imaging. For example, a slice and image method can be performed at different geometries of a focused ion beam (FIB) system for milling and a charged particle beam microscope (CPBM) for imaging. In a first example, the first plurality of two-dimensional images can be obtained at an extracted sample piece of a wafer with a FIB system arranged perpendicular to a surface of the sample piece of the wafer. In a second example, the second plurality of two-dimensional images can be obtained at a wafer with a FIB system arranged at a slanted angle to a surface of the wafer. For example, the plurality of two-dimensional images can be obtained with different CPBMs, for example a scanning electron microscope (SEM) or a Helium Ion Microscope (HIM). With the first step of generating a standardized 2D-image dataset with a 2D-processing module, the plurality of two-dimensional images is converted to a predetermined format for further processing of the images and extraction of an inspection result according to a selected inspection task.

According to an example, the first step P1 comprises at least one first sub-step selected from a group of method steps including method steps for a selection of an inspection site on a wafer and a selection of an inspection sample piece. The first step P1 further comprises at least one second sub-step selected from a group of method steps including method steps for a configuration of an inspection volume, a lateral resolution, a milling distance. The first step P1 further comprises at least one third sub-step selected from a group of method steps including method steps for forming alignment markers or fiducials close to or within the inspection volume. The first step P1 further comprises at least one fourth sub-step selected from a group of method steps including method steps for an iterative sequence of milling and imaging. The first step P1 further comprises at least one sixth sub-step selected from a group of method steps including method steps of writing the plurality of two-dimensional images into a common access memory.

In an example, the predetermined specification is a specification of the second 3D data processing step P2. In an example, the at least one monitoring sub-step or fifth sub-step comprises selecting or discarding at least one of the plurality of two-dimensional images 2DI. In an example, the at least one monitoring sub-step comprises flagging of image regions of the at least one of the plurality of two-dimensional images, which are not in conformity with the predetermined specification. In an example, the step of evaluating the at least one of the plurality of two-dimensional images 2DI comprises evaluating an image property selected from a group of image properties including an image contrast, an image resolution, a presence of specific features within a 2D image, an accuracy of an image of a fiducial or alignment marker. In an example, the method further comprises, based on the at least one fifth or monitoring sub-step, triggering an adjustment from a group including a re-alignment of a wafer or a wafer sample by a wafer stage, a shift of the imaging beam, an adjustment of an imaging parameter of a charged particle beam imaging system, for example a focus adjustment, an increase of a dwell time, or a compensation of an aberration of the charged particle beam imaging system, and an adjustment of a milling angle or a milling range of a focused ion beam. In an example, the method further comprises triggering a repetition of an image acquisition of a two-dimensional image if the two-dimensional image is not in conformity with the predetermined specification.

The second, 3D data processing method P2 can comprise receiving the plurality of two-dimensional images 2DI from the common access memory M1 and extracting a 3D inspection result from the two-dimensional images 2DI. In an example, the second 3D data processing method P2 further comprises at least one 2D-processing sub-step for generating a standardized 2D-image dataset from the plurality of two-dimensional images. The second 3D-data processing method P2 may further comprise at least one 2.5D data fusion sub-step for modifying the standardized 2D-image dataset. The second 3D data processing method P2 can further comprise at least one 3D-data fusion sub-step for generating a 3D-volume image dataset from the standardized 2D-image dataset.

The second 3D-data processing method P2 can comprise at least one 3D-processing sub-step for determining at least one attribute of a 3D-semiconductor object of interest included within the 3D-volume image dataset. The at least one 3D-processing sub-step can comprise at least one operation selected from a group of operations including 2D-intersection operations, 3D-volume object operations, 3D-object classification operations and metrology operations. The second 3D data processing method P2 further can comprise at least one extraction sub-step for extraction, display and storing of an inspection result IR from the at least one attribute. The at least one extraction sub-step can comprise at least one operation selected from a group of operations including data sorting operations, data analysis operations, and display operations.

In an example, at least one sub-step of each of the first step P1 for acquiring a plurality of two-dimensional images 2DI and the second, 3D data processing step P2 is performed at least partially in parallel.

The workflow architecture for 3D volume inspection can comprise the fifth or monitoring sub-step during image acquisition and is therefore more robust against disturbances or user errors and thus well suited for automated execution of 3D volume inspection tasks with a dual beam device within a routine environment. The fifth or monitoring sub-step ensures that 2D cross section images generated by a slice-and image method are in compliance with the desired properties of a at least partially subsequent 3D data processing workflow, such that a predetermined 3D inspection result can be generated without loss of time or undesired destruction of inspection sites.

According to an aspect of the disclosure, a system for 3D wafer inspection comprises a dual beam system including a first charged particle or FIB column for milling of at least one cross-section surface through an inspection volume in of a wafer, and a second, charged particle beam imaging system for high-resolution imaging of the at least one cross section surface. The system further comprises a wafer support table for holding during use a wafer and a control unit with a first internal memory and logic configured to control an operation of the dual beam system according to a first method for acquiring a plurality of two-dimensional images 2DI according to the disclosure. The system further comprises or connected to a processing system, configured with a second internal memory at least one processing engine configured for execution of the second, 3D data processing step P2 according to the disclosure.

According to an aspect of the disclosure, a method of configuring of a 3D-inspection workflow comprises a first, user specification step of specifying a 3D inspection task and a second, configuration step of configuring a 3D data processing method P2. The method comprises a third step of determining at least one specification of a plurality of two-dimensional images to be generated by a dual beam device with a slice-and imaging method, and a fourth, configuration step of configuring a method P1 for acquiring the plurality of two-dimensional images 2DI to reach the specification. In a fifth configuration step, at least one executable software code is implemented for parallel execution.

The second configuration step can comprise configuring a sub-step of extracting an inspection result from the plurality of two-dimensional images of a semiconductor object of interest. In an example, the configuration method further comprises a generation of a template of the second, 3D-data processing step P2 for 3D-data processing, and an emulation of the template by a simulation method selected from a group including a model-based simulation, for example by a simulation using a representative plurality of two-dimensional test images. The configuration method can further comprise a step of verifying that a first specification according to first configuration step is achieved during execution of the template of the second, 3D-data processing step P2. The at least one specification of the plurality of two-dimensional images 2DI can be selected from a group of desired properties including a lateral resolution and image contrast, an acceptable noise level, a sampling distance of 2D-images perpendicular to an image plane of a 2D-image, an inclusion of alignment marks or fiducials for lateral or 3D alignment and registration and an image sampling strategy, for example including a limitation to regions of interest or a sparse image sampling strategy.

The fourth configuration step can comprise a step of selecting at least one operation according to a predetermined performance limitation or constraint of the operation. The fifth configuration step can comprise a step of implementing of a first executable software code of the first step P1 into a controller of a dual beam device and implementing a second executable software code of the second, 3D data processing step P2 for 3D-data into a processing computer system.

In an aspect, the disclosure provides a method of configuring a 3D data processing method P2 for 3D-inspection of a 3D semiconductor object of interest from a plurality of two-dimensional images is described. The method comprises selecting at least one 2D-processing module from a first class of modules for generating a standardized 2D-image dataset from a plurality of two-dimensional images and selecting at least one 3D data fusion module from a third class of modules for generating a 3D-volume image dataset VDS from the standardized 2D-image dataset. The method further comprises the steps of selecting at least one 3D-processing module from a fourth class of modules for determining at least one attribute of a 3D semiconductor object of interest and selecting at least one extraction module from a fifth class of modules for extraction and display of an inspection result from the at least one attribute.

According to an aspect, the disclosure provides a method of configuring a 3D-data processing method of a plurality of two-dimensional images generated by a slice and image method. A sequence of dedicated processing modules is proposed for a processing of the standardized 2D-image dataset. The selection of the sequence of processing modules can be improved by user specifications of a selected inspection task on a selected semiconductor device, for example a highly repetitive memory device of a logic device.

In an example, the method further comprises a step of selecting at least one 2D-processing module from a first class of modules including image registration modules, image processing modules, image analysis modules and image conversion modules. The method can further comprise a step of selecting at least one 3D-data fusion module from a third class of modules MC3 including 3D-volume data fusion modules, a 3D-conversion module, and 3D-display modules. In an example, the method comprises a step of selecting at least one 3D-processing module from a fourth class of modules including 2D-intersection modules, 3D-volume object modules, 3D-object classification modules and metrology modules. The method can further comprise a step of selecting at least one extraction module from a fifth class of modules including data sorting modules, data analysis modules, and display modules.

In an example, the method further comprises a step of selecting at least one 2.5D data fusion module from a second class of modules. In an example, the step of selecting at least one 2.5D data fusion module from a second class of modules MC2 including modules for 2D-image-to-image alignment, a 2D-image averaging, and a 3D pixel interpolation from at least two two-dimensional-images.

In an example, the method further comprises the steps of selecting displaying a list of predefined inspection tasks, receiving a user input of a selection of an inspection task from the list of predefined inspection tasks, displaying at least one specification of the inspection result of the selected inspection task, and receiving a user input of the at least one specification of the inspection result. The step of receiving the at least one specification of the inspection result can comprise receiving a specification of the at least one attribute from a group of attributes including of a classification label, a measure, a descriptive parameter of a parametrized description of a 2D-object or 3D-volume object.

In an example, the method further comprises the steps of displaying a list of modules of at least one class of modules, pre-selecting at least one module of the at least one class of modules for recommended user selection according to the specification of the inspection result or other, previously selected modules, and receiving a user interaction of a selection or confirmation of a selected module.

In an example, the method further comprises the steps of specifying at least one selected module, comprising specifying at least one input specification and specifying at least one output specification. In an example, the step of specifying at least one output specification of a selected module is performed in compliance an input specification of a subsequent module.

In an example, the method further comprises a step of specifying at least one module performance specification selected from a group of specifications including an alignment or registration accuracy, an accuracy of a depth map computation, a minimum number of measurements for statistical evaluation, a polynomial degree of a parametric description of a semiconductor object of interest. In an example, the method further comprises a step of specifying at least one method of the selected module selected from a group of methods including a numerical method or an algorithm from a list of optional numerical methods or algorithms. In an example, the method further comprises a step of receiving a user instruction for specifying an input source for receiving the plurality of two-dimensional images.

In an example, the method further comprises a step of generating an executable software code of the data processing workflow and storing the executable software code in a non-volatile memory.

According to an aspect, the disclosure provides a dual beam charged particle beam apparatus for wafer inspection comprises a focused ion beam system (FIB) and a scanning electron microscope (SEM). The apparatus further comprises a computer system configured for execution of a method of configuring a 3D data processing method P2 for 3D-inspection of a 3D semiconductor object of interest from a plurality of two-dimensional images 2DI.

According to an aspect of the disclosure, a method of 3D wafer inspection comprises the steps of receiving a plurality of two-dimensional images comprising at least one 2D-image from at least one cross-section through a semiconductor wafer, the step of configuring a 3D-data processing workflow according to the disclosure and executing the 3D-data processing workflow on the plurality of two-dimensional images 2DI. In an example, the method comprises milling at least one cross-section surface with a focused ion beam system (FIB) into a semiconductor wafer at an angle>10°, for example between 10° and 90° to the surface of a semiconductor wafer and forming the at least one 2D-image from the at least one cross-section surface with a scanning electron microscope (SEM). In an example, the method comprises milling a plurality of N cross-section surface with a focused ion beam system (FIB) into a semiconductor wafer at an angle>10°, for example between 10° and 90° to the surface of a semiconductor wafer, and forming a plurality of M two-dimensional images from the plurality of N cross-section surfaces with a scanning electron microscope (SEM), wherein M is equal to or less than N and wherein N is larger than 1, for example N=100, N=1000, or even more.

Embodiments can be configured to assist a user during the selection and configuration and specification of elements or modules to be used in a specific 3D volume inspection method according to a 3D volume inspection task of a semiconductor wafer.

The disclosure described by examples and embodiments is not limited to the embodiments and examples but can be implemented by those skilled in the art by various combinations or modifications.

BRIEF DESCRIPTION OF THE DRAWINGS

The present disclosure will be even more fully understood with reference to the following drawings, in which:

FIG. 6 illustrates a 3D wafer inspection system;

FIG. 10 illustrates a method of specifying at least one selected method step of a data processing method.

DETAILED DESCRIPTION

Throughout the figures and the description, same reference numbers are used to describe same or similar features or components. The coordinate system is selected that the wafer surface 55 coincides with the XY-plane.

For the investigation of 3D inspection volumes in semiconductor wafers, different slice and imaging methods have been proposed, which are applicable to inspection volumes inside a wafer or to sample pieces extracted from a wafer. The slice-and image method is generally applied to an inspection volume with dimensions of few μm, for example with a lateral extension of 5 μm to 10 μm or up to 50 μm. In the first example, a 3D volume image is generated at an inspection volume inside a wafer in the so called "wedge-cut" approach or wedge-cut geometry, without the need of a removal of a sample from the wafer. A V-shaped groove or trench is milled in the top surface of an integrated semiconductor wafer to make accessible a cross-section surface at a slanted angle to the top surface. 3D volume images of inspection volumes are acquired at a limited number of measurement sites, for example representative sites of dies, for example at process control monitors (PCM), or at sites identified by other inspection tools. The slice and image method will destroy the wafer only locally, and other dies may still be used, or the wafer may still be used for further processing. The methods and inspection systems according to the 3D Volume image generation are described in WO 2021/180600 A1, which is fully incorporated herein by reference.

Figure 1:
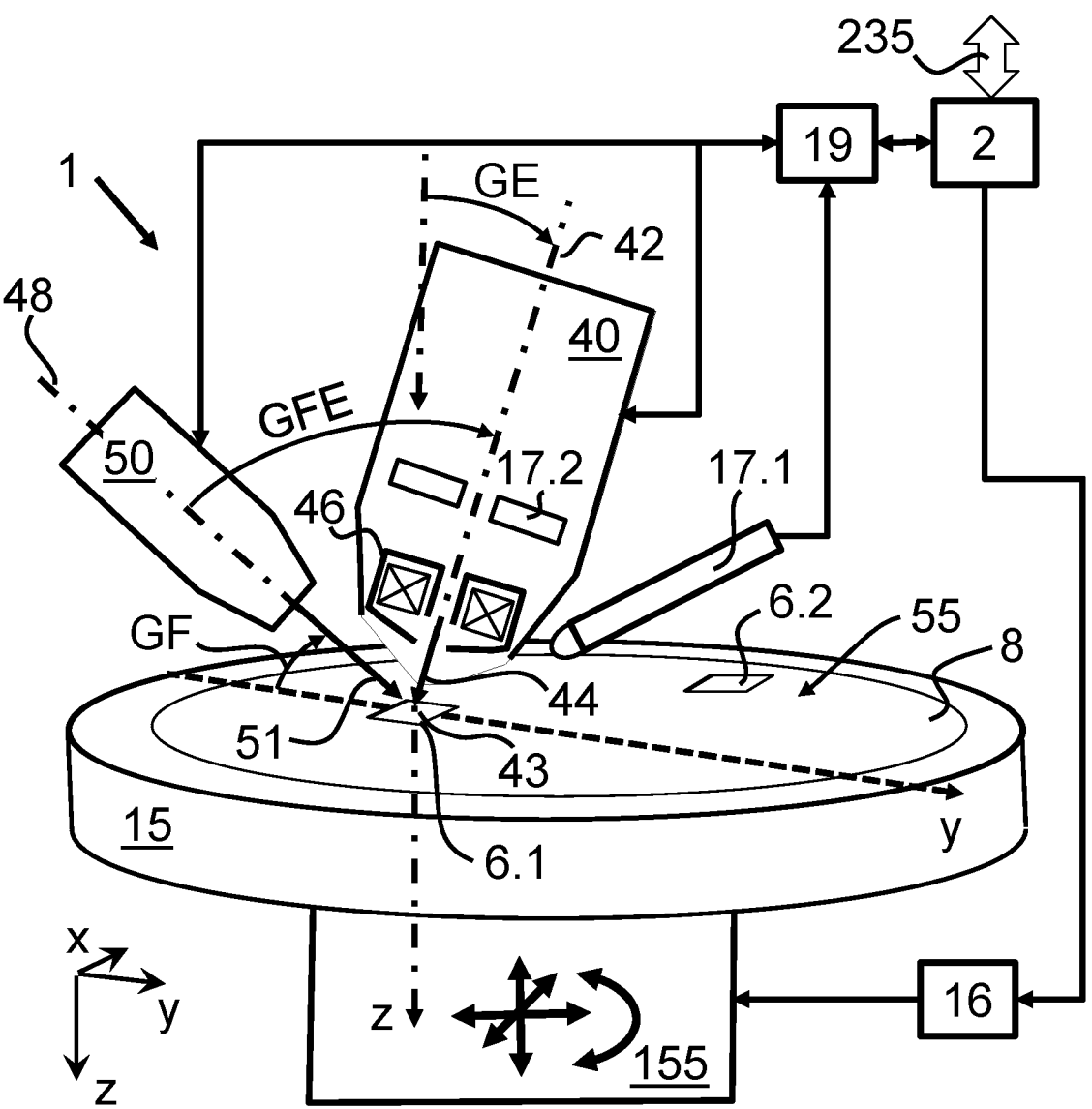
FIG. 1 shows an illustration of a dual beam system for 3D volume inspection.

A dual beam system for 3D volume inspection is illustrated in FIG. 1. The dual beam system 1000 for high-throughput 3D volume inspection is configured for a slice-and imaging method under wedge cut geometry with a dual beam device 1. The operation control unit 2 is configured to perform a 3D inspection inside an inspection volume 160 in a wafer 8. For a wafer 8, several measurement sites, comprising measurement sites 6.1 and 6.2, are defined in a location map or inspection list generated from an inspection tool or from design information. The wafer 8 is placed on a wafer support table 15. The wafer support table 15 is mounted on a stage 155 with actuators and position control 21. Actuators and a mechanism for precision control 21 for a wafer stage 155 such as Laser interferometers are known in the art. A control unit 16 receives information about the actual position of the wafer stage 155 and is configured to control the wafer stage 155 and to adjust a measurement site 6.1 of the wafer 8 at the intersection point 43 of the dual-beam device 1. The dual beam device 1 comprises a FIB column 50 with a FIB optical axis 48 and a charged particle beam (CPB) imaging system 40 with optical axis 42. At the intersection point 43 of both optical axes of FIB and CPB imaging system, the wafer surface 55 is arranged at a slant angle GF to the FIB axis 48. FIB axis 48 and CPB imaging system axis 42 include an angle GFE. In the coordinate system of FIG. 1, the normal to the wafer surface 55 is given by the z-axis. The focused ion beam (FIB) 51 is generated by the FIB-column 50 and is impinging under angle GF on the surface 55 of the wafer 8. Slanted cross-section surfaces are milled into the wafer by ion beam milling at the inspection site 6.1 under approximately the slant angle GF at a predetermined y-position, which is controlled by the stage 155 and position control 21. In the example of FIG. 1, the slant angle GF is approximately 30°. The actual slant angle of the slanted cross-section surface can deviate from the slant angle GF by up to 1° to 4° due to the beam divergency of the focused ion beam, for example a Gallium-Ion beam, or due to variable material properties with respect to milling along the cross-section surface. With the charged particle beam imaging system 40, images of the milled surfaces are acquired. In the example of FIG. 1, the charged particle beam imaging system 40 is arranged with its charged particle beam 44 perpendicular to the wafer surface 55 and parallel to the z-axis. In other configurations, the optical axis 42 of the charged particle beam imaging system 40 is arranged at an angle to the z-axis.

During imaging, a beam of charged particles 44 is scanned by a scanning unit of the charged particle beam imaging system 40 along a scan path over a cross-section surface of the wafer at measurement site 6.1, and secondary particles as well as backscattered particles are generated. Particle detector 17.1 or an optional internal particle detector 17.2 collect at least some of the secondary particles and/or backscattered particles and communicate the particle count with a control unit 19. Other detectors for other kinds of interaction products such as x-rays or photons may be present as well. The control unit 19 is in control of the charged particle beam imaging column 40 and of the FIB column 50 and connected to a control unit 16 to control the position of the wafer mounted on the wafer support table 15 via the wafer stage 155. Operation control unit 2 communicates with control unit 19, which triggers placement and alignment for example of measurement site 6.1 of the wafer 8 at the intersection point 43 via wafer stage movement and triggers repeatedly operations of FIB milling, image acquisition and stage movements. Furthermore, operation control unit 2 may control a generation of alignment fiducials in proximity to an inspection site 6.1 or 6.2, and may control a repeated alignment of a stage position. Furthermore, operation control unit 2 may be connected to other control units, a data server or a processing engine via interconnection 235.

A memory is further provided to store digital image data. Operation control unit 2 may further trigger an image processing of the digital images and a determination of a result of the inspection task.

Control unit 19 and Operation control unit 2 comprises a memory for storing the many instructions in form of software code and at least one processer to execute during operation sequence of the many instructions. Operation control unit 2 may further comprise a user interface or an interface to other communication interfaces to receive instructions, prior information and to transfer inspection results.

Each new cross-section surface is milled by the FIB beam 51, and imaged by the charged particle imaging beam 44, which is for example scanning electron beam or a Helium-Ion-beam of a Helium ion microscope (HIM). Each charged particle beam system of the dual beam system is thereby controlled by several parameters of a group of parameters comprising at least one of a charged particle beam current, a kinetic energy of charged particles, a scanning frequency or dwell time, a scanning strategy, a focusing method, or a beam angle. The image acquisition by the charged particle beam imaging system 40 further comprises a definition of the detection strategy, for example s selection of at least one of the particle detector 17.1 or 17.2.

The operation control unit 2 is further configured to reconstruct the properties of semiconductor structures of interest from the 3D volume image. In an example, features and 3D positions of the semiconductor structures of interest, for example the positions of the HAR structures, are detected by the image processing methods, for example from HAR centroids. A 3D volume image generation including image processing methods and feature based alignment is further described in WO 2020/244795 A1, which is hereby incorporated by reference.

Figure 2:
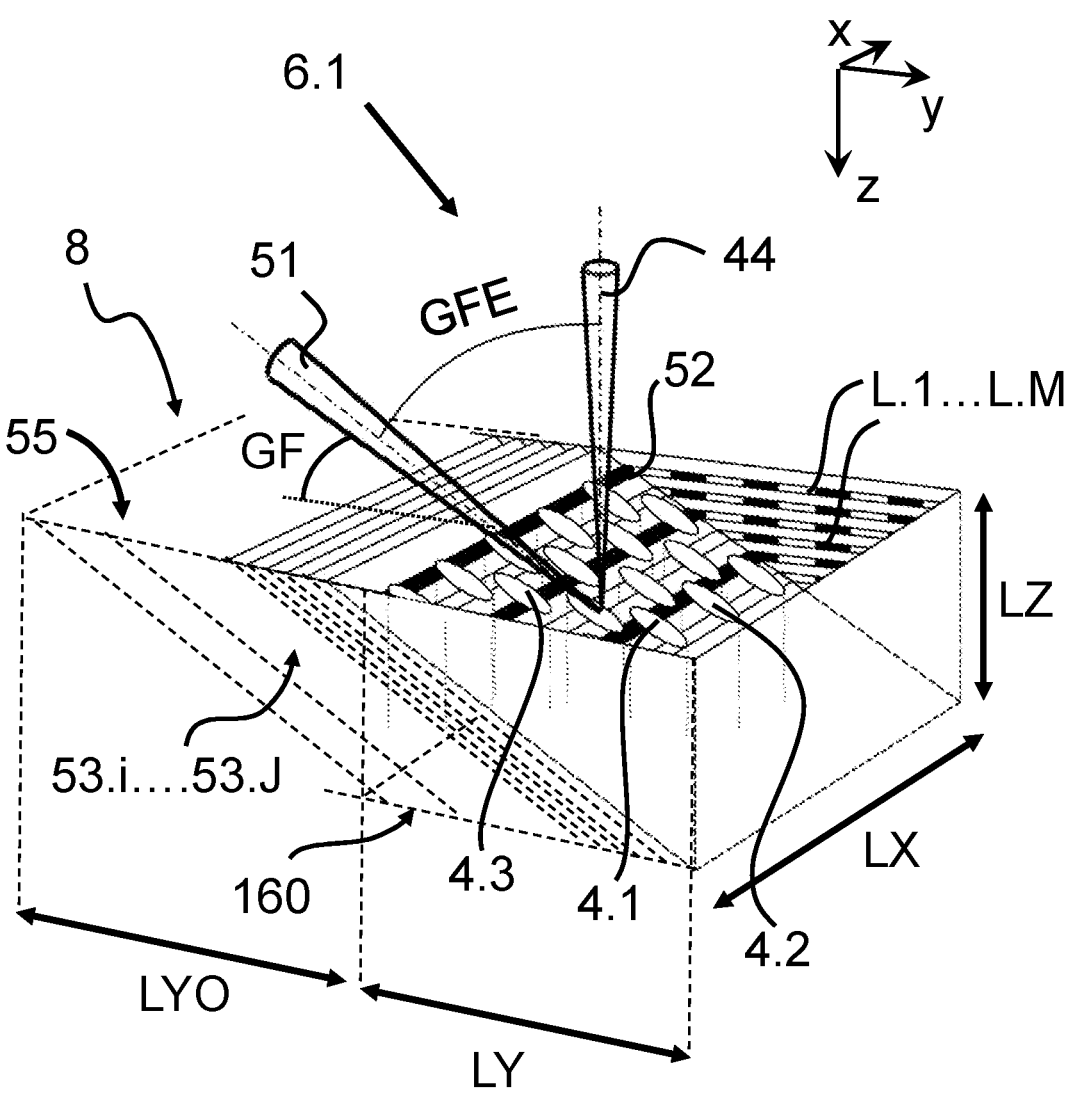
FIG. 2 is an illustration of a slice and imaging method in a wafer with a slanted cross section milling and imaging by a dual beam device.

FIG. 2 illustrate further details of the slice and imaging method in the wedge cut geometry. By repetition of the slicing and imaging method in wedge-cut geometry, a plurality of J cross-section averaged image slices comprising averaged image slices of cross-section surfaces 52, 53.*i* . . . 53.J is generated and a 3D volume image of an inspection volume 160 at an inspection site 6.1 of the wafer 8 is generated. FIG. 2 illustrates the wedge cut geometry at the example of a 3D-memory stack. The cross-section surfaces 53.1 . . . 53.J are milled with a FIB beam 51 at an angle GF of approximately 30° to the wafer surface 55, but other angles GF, for example between GF=20° and GF=60° are possible as well. FIG. 2 illustrates the situation, when the surface 52 is the new cross-section surface which was milled last by FIB 51. The cross-section surface 52 is scanned for example by SEM beam 44, and a high-resolution cross-section averaged image slice is generated. The cross-section averaged image slice comprises first cross-section image features, formed by intersections with high aspect ratio (HAR) structures or vias (for example first cross-section image features of HAR-structures 4.1, 4.2, and 4.3) and second cross-section image features formed by intersections with layers L.1 . . . . L.M, which comprise for example SiO2, SiN— or Tungsten lines. Some of the lines are also called "word-lines". The maximum number M of layers is typically more than 50, for example more than 100 or even more than 200.

The HAR-structures and layers extend throughout most of the inspection volume in the wafer but may comprise gaps. The HAR structures typically have diameters below 100 nm, for example about 80 nm, or for example 40 nm. The HAR structures are arranged in a regular, for example hexagonal raster with a pitch of about below 300 nm, for example even below 250 nm. The cross-section averaged image slices contain therefore first cross-section image features as intersections or cross-sections of the HAR structures at different depth (Z) at the respective XY-location. In case of vertical memory HAR structures of a cylindrical shape, the obtained first cross-sections image features are circular or elliptical structures at various depths determined by the locations of the structures on the sloped cross-section surface 52. The memory stack extends in the Z-direction perpendicular to the wafer surface 55. The thickness d or minimum distances d between two adjacent cross-section averaged image slices is for example variably adjusted to values typically in the order of few nm, for example 30 nm, 20 nm, 10 nm, 5 nm, 4 nm or even less. Once a layer of material of predetermined thickness d is removed with FIB, a next cross-section surface 53.*i* . . . 53.J is exposed and accessible for imaging with the charged particle imaging beam 44.

A plurality of J cross-section image slices acquired in this manner covers an inspection volume of the wafer 8 at measurement site 6.1 and is used for forming of a 3D volume image of high 3D resolution below for example 10 nm, such as below 5 nm. The inspection volume 160 (see FIG. 2) typically has a lateral extension of LX=LY=5 µm to 15 µm in x-y plane, and a depth LZ of 2 µm to 15 µm below the wafer surface 55. However, the extensions can also be larger and reach for example 50 µm.

Figure 3:
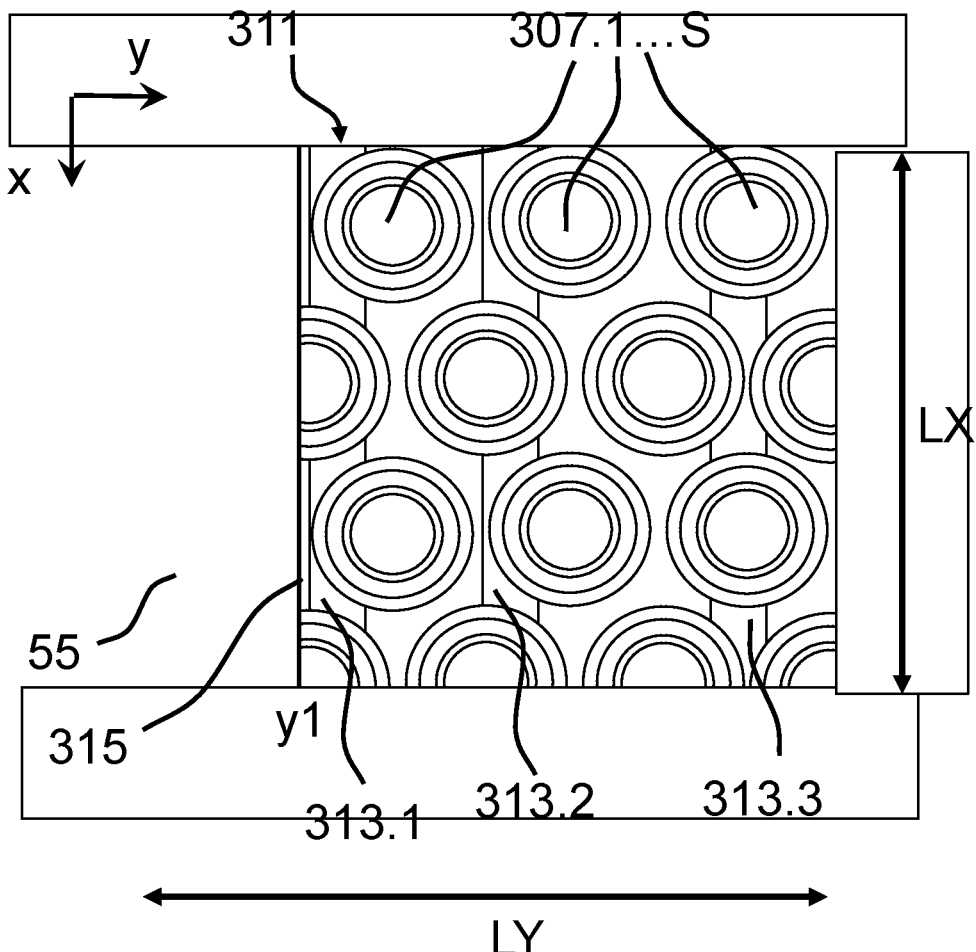
FIG. 3 illustrates an example of a 2D image.

FIG. 3 shows a typical image slice 311 generated by the imaging charged particle beam 44 and corresponding to the ith cross-section surface 53.*i*. The image slice 311. comprises an edge line 315 between the slanted cross-section and the surface 55 of the wafer at the edge coordinate yi. Right to the edge, the image slice 311 shows several cross-sections 307.1 . . . 307.S through HAR structures which are intersected by the cross-section surface 301.i. In addition, the image slice 311 comprises cross sections 313.1 to 313.3 of several word lines at different depths or z-positions. Depending on the inspection task and the desired properties of the inspection task, different semiconductor features in each image slice 311 are to be detected and different parameters of semiconductor features are to be determined.

According to the slice an image method at wedge cut geometry, the plurality of 2D images is generated at a slanted angle through an inspection volume. It is however also possible to apply a slice-and image method in other geometries. For example, a block-shaped sample piece can be extracted from a wafer and fixed to a sample support mounted on a sample stage. FIB and CPBM can be arranged at 90°, and milling by the FIB is performed for example perpendicular to the wafer surface 55. Two-dimensional images are obtained by the CPBM in a direction for example parallel to y-direction in FIG. 2. Alternatively, milling is performed in parallel to the Y-direction and parallel to the wafer surface 55, and 2D-images are obtained from layers parallel to the wafer surface 55. Thereby, a plurality of 2D-images is obtained with an orientation either perpendicular or parallel to a wafer surface 55. Depending on the geometry of the slice-and image method used for acquisition of the plurality of 2D images, the 2D-images can have different structure of the image data, for example a different resolution, different image or material contrast, a different orientation within a 3D inspection volume, different image content, or a different 2D-image size.

Figure 4:
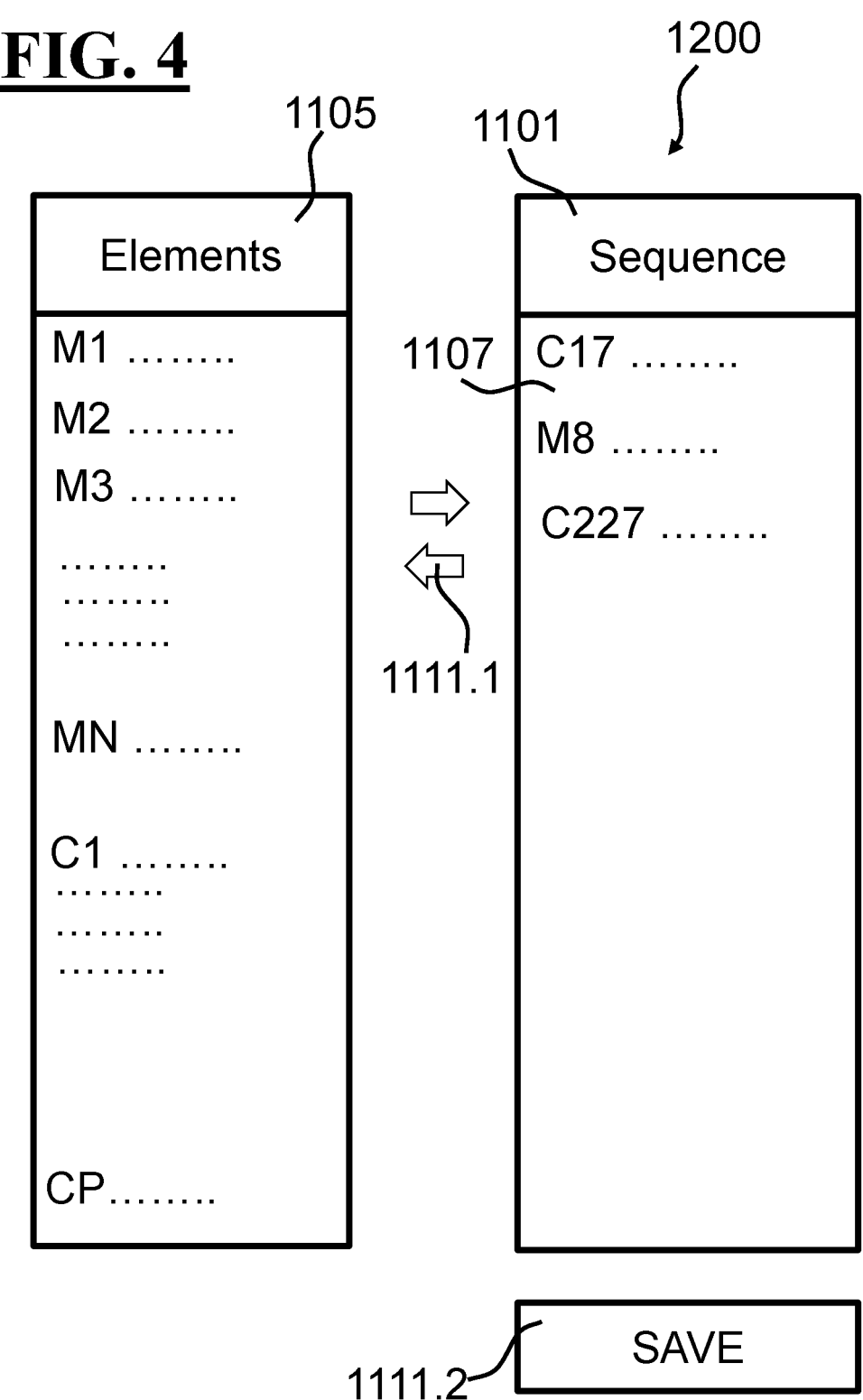
FIG. 4 illustrates a conventional workflow configuration.

The configuration of the sequence of instructions and operations of an inspection task of a property of a semiconductor feature in a 3D volume can involve the proper selection and arrangement of up to more than 1000 individual workflow steps, including the repetition of many sequences of workflow loops, which can involve comprehensive knowledge about the dual beam system. So far, there are only available specifically tailored workflows for routine inspection tasks, tailored by experts having deep expert knowledge for configuration of the workflows to be executed. One the other hand, there are available general workflow generators including module libraries for any kind of any task for the general laboratory use of a dual beam system, capable for various tasks including analysis of biological tissue, TEM sample preparation, staining for material analysis, and so on, which are not required during 3D volume semiconductor inspection. FIG. 4 illustrates a typical workflow or method sequence builder 1200 of the prior art. A sequence of method steps 1101 is configured by selected method steps 1107 from a huge list of instructions or optional method steps 1105, comprising preconfigured elements Mi with i=1 . . . . N and custom elements Cj with j=1 . . . . P. The number N and P of preconfigured elements Mi and custom elements Ci is hereby not limited, and each group of elements can comprise more than one hundred individual optional elements for selection into the workflow sequence 1101. The workflow or method sequence builder 1200 further comprises user interfaces 1111 configured for example fer receiving a user command regarding the selection or deselection of method steps 1105, 1107 and for finishing and a configuration of a 3D inspection method with for example save-button 1111.2. A configuration of a workflow for 3D semiconductor inspection with such a generalpurpose workflow builder 1200 can be very sensitive to errors and can involve comprehensive experimentation. Furthermore, typical workflow builders for charged particle beam systems are of limited capability with regard to 3D image processing.

According to a first embodiment, a 3D-inspection workflow is provided, which is split into two parts:

a first step comprising method steps for acquiring the plurality of two-dimensional (2D) images according to a desired properties of a generated data processing method, and a second step comprising a 3D data processing method, including an extraction of an inspection result from a plurality of two-dimensional (2D) images of a semiconductor object of interest.

Figure 5:
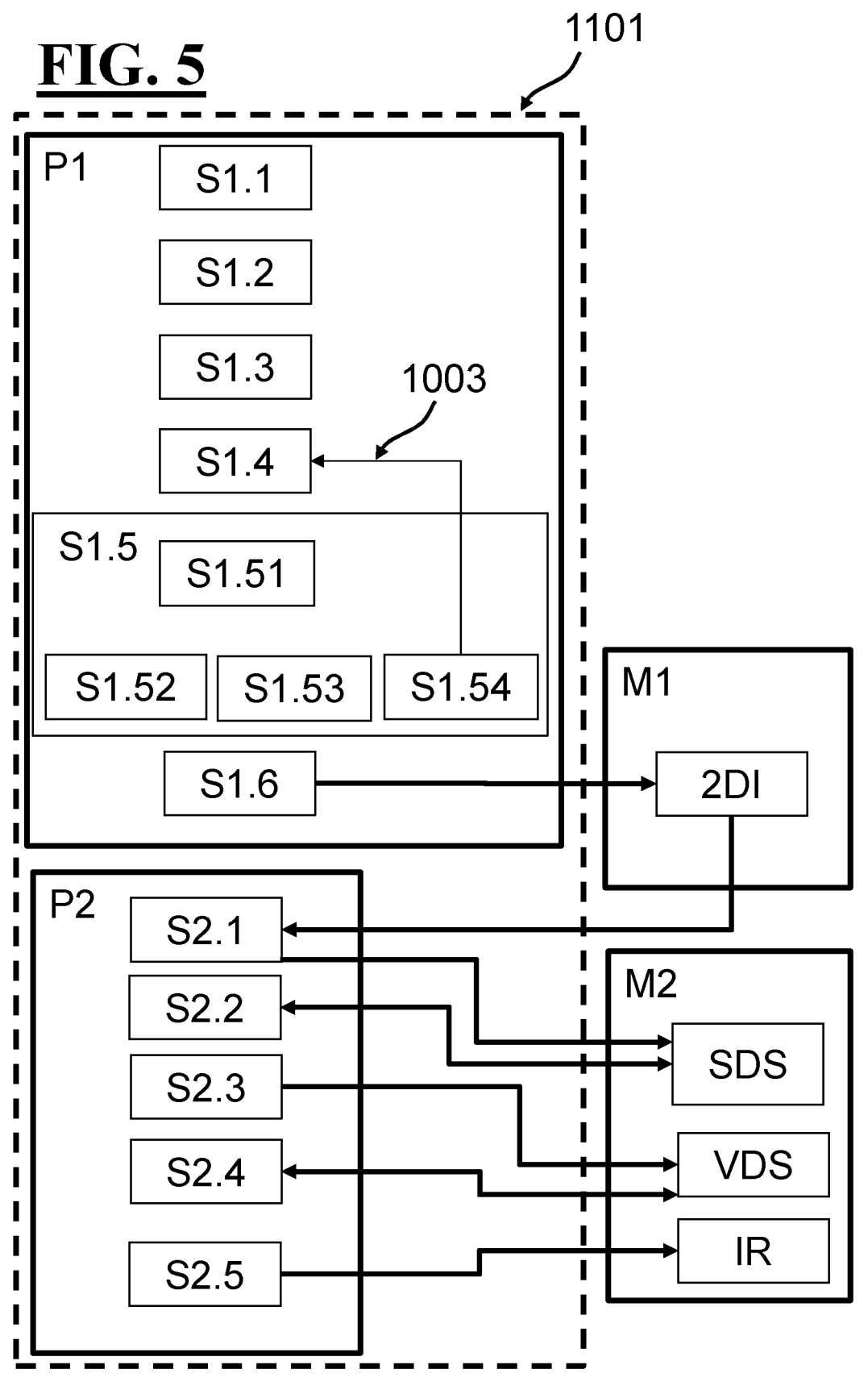
FIG. 5 illustrates a 3D-Inspection method.

An example of a 3D-inspection workflow 1101 according to the first embodiment is illustrated in FIG. 5. The 3D-inspection workflow 1101 comprises a first step P1 for acquiring the plurality of two-dimensional (2D) images. The first step P1 comprises of a sequence of operations or sub-steps for acquiring the plurality of two-dimensional (2D) images from several groups of method steps. Generally, the selection and configuration of the operations or sub-steps is depending on an inspection task of a semiconductor object of interest and the desired inspection result IR. The method sub-steps of the first step P1 are including a first sub-step selected from a group of method steps S1.1 for a selection of an inspection site on a wafer or a selection of an inspection sample piece;

a second sub-step S1.2 for a configuration of an inspection volume, a lateral resolution, a milling distance;

a third sub-step S1.3 for forming alignment markers or fiducials close to or within the inspection volume;

a fourth sub-step S1.4 for an iterative sequence of milling and imaging, as for example described above, wherein the imaging steps are configured to include an imaging of the alignment markers or fiducials within each 2D image;

a fifth sub-step S1.5 for quality monitoring of each of the 2D images;

a sixth sub-step S1.6 of writing the plurality of 2D images 2DI into a common access memory M1.

The sub-steps S1.5 for a quality monitoring (also called "Watchdog") are configured to evaluate each of the plurality of 2D images for conformity with the desired properties of the data processing method according to the second part of 3D-inspection workflow. In an example, a fifth sub-step S1.5 is selected from a group of method steps including a determination-step S1.51, whether an 2D image property is in conformity with the predetermined conditions or desired properties of a subsequent data processing method;

a selection- or discarding-step S1.52 of entire 2D-images;

a flagging-step S1.53 of image regions of 2D-images, which are not in compliance with the conditions or desired properties of a subsequent a data processing method.

In an example, a step S1.51 for evaluating at least one of the plurality of two-dimensional images 2DI comprises an evaluation of an image contrast, an image resolution, a detection of specific features within a 2D image, or a determination of an accuracy of an D image of a fiducial or alignment marker.

An image contrast or visibility V of a 2D image I(x,y) is for example determined by computing $V=(max(I(x,y))-min(I(x,y)))/(max(I(x,y))+min(I(x,y)))$. A local image contrast or image resolution can for example be determined by computing the normalized image log slope $NILS(x,y)=[d\ ln(I(x,y))/dx;\ d\ ln(I(x,y))/dy]$. A detection of specific features can be accomplished by object detectors using well known machine learning algorithms or matched filters. An accuracy of an alignment marker can be determined according to a noise level or a NILS across the image of the alignment marker.

In an example, the first method P1 further comprises a feedback loop 1003. The steps S1.5 for a quality monitoring are configured to determine in step S1.51 whether an acquired 2D image is in conformity with the desired properties of a subsequent data processing method and include a further step S1.54 of triggering an adjustment or repetition of a milling or image acquisition in step S1.4. The step S1.54 of triggering an adjustment or repetition of an image acquisition in step S1.4 comprises at least one method step selected from a group including a re-alignment of the wafer or wafer sample by a wafer stage;

an adjustment of an imaging parameter of the charged particle beam device, for example a focus adjustment, an increase of a dwell time, or a compensation of an aberration of an charged particle imaging beam;

an adjustment of a milling angle or a milling range.

In a further example (not shown), the step S1.54 of triggering an adjustment or repetition can further trigger a repetition of step S1.3 for forming a further alignment marker or fiducial.

In an example, the evaluation of a 2D image in step S1.51 includes a computation of an image sharpness or resolution, for example by computing a Fourier spectrum of a 2D image, determining a width or extension of a Fourier spectrum in at least a horizontal or vertical direction and comparing the widths or extensions with a predetermined threshold. If the extension is above a predefined threshold, the 2D image is within a desired image sharpness or resolution. If the extension is below a predefined threshold, the 2D image is for example out of focus and a focus adjustment is triggered and an image acquisition is repeated. In another example, Fourier spectrum extension in vertical and horizontal direction might show a significant difference exceeding a predetermined threshold, and a compensation of an astigmatism by a multi-pole electro-optical element (stigmator) is triggered.

Typically, step S1.3 for forming an alignment marker or fiducial comprises a determination of the position for an alignment fiducial with the charged particle beam imaging system;

a deposition of a metal layer of finite extension at the position of the alignment fiducial, generated by charged particle beam induced deposition of for example Tungsten from Tungsten hexacarbonyl. Tungsten hexacarbonyl is provided by a gas nozzle during the deposition with the charged particle beam of the charged particle beam imaging system;

a physical ion beam milling with for example a Gallium beam of the alignment fiducial into the metal layer.

a registration of the position of the fabricated alignment fiducial relative to existing alignment features of a wafer with the charged particle beam imaging system.

The 3D-inspection workflow 1001 comprises a second part, a data processing method P2 for data processing. A data processing method P2 is including an extraction of an inspection result of a 3D-inspection task from a plurality of two-dimensional images of a 3D semiconductor object of interest. Generally, the selection and configuration of the method steps of the data processing method P2 is depending on an inspection task of a semiconductor object of interest and the desired inspection result IR.

A data processing method P2 comprises a sequence of method steps from different modules, comprising at least one 2D-processing sub-step S2.1 for generating a standardized 2D-image dataset SDS from a plurality of two-dimensional images 2DI from common access memory M1 and for storing the standardized 2D-image dataset SDS into memory M2. According to an example, the image regions flagged in step 1.53 as not in compliance with the specification are discarded during the step of generating the standardized 2D-image dataset SDS.

In an example, a data processing method P2 further comprises a 2.5D data fusion sub-step S2.2 for modifying the standardized 2D-image dataset SDS.

A data processing method P2 further comprises at least one 3D-data fusion sub-step S2.3 for generating a 3D-volume image dataset VDS from the standardized 2D-image dataset SDS and for storing the 3D-volume image dataset VDS in memory M2. A 3D-data fusion sub-step S2.3 can further comprise 3D-volume data fusion modules, a 3D-conversion modules, and 3D-display modules.

A data processing method P2 further comprises at least one 3D-processing sub-step S2.4 for determining at least one attribute of a 3D-semiconductor object of interest included within the 3D-volume image dataset VDS. The at least one attribute is selected from a group including a classification label, a measure, and a descriptive parameter of a parametrized description of a 2D-object or 3D-volume object within the 3D-volume image dataset.

A data processing method P2 further comprises at least one extraction sub-step S2.5 for extraction, display and storing of an inspection result IR from the at least one attribute.

According to an example, the at least one 2D-processing module S2.1 comprises at least one module from a group including image registration modules, image processing modules, image analysis modules and image conversion modules:

Image registration modules are configured to perform an image registration operation selected from a group including an alignment of a 2D-image in a 3D-coordinate system, an adjustment of an image magnification, or a compensation of a distortion.

Image processing modules are configured to perform an image processing operation selected from a group including a filter operation, a convolution, a morphologic operation, a contour enhancement, a noise reduction, a threshold operation, and a brightness or contrast adjustment.

Image analysis modules are configured to perform an image analysis operation selected from a group including a detection and classification of 2D-objects, a determination of a parametrized description of a 2D-object, a determination of at least one property of a 2D-object, such as a center position, a length, an area, or a shape. The group of image analysis operations further includes a determination of a depth map of a 2D-image.

Image conversion modules are configured to perform an image conversion operation of an input format of the 2D-image 2DI into a standardized format of the standardized 2D-image dataset SDS.

In an example, the at least one 2D-processing module S2.1 comprises three modules, including an image registration module, an image analysis module, and an image conversion module.

Image analysis modules may include machine learning methods such as an object detector.

According to an example, a 2.5D data fusion module S2.2 is configured to perform an operation selected from a group of operations including a 2D-image-to-image alignment, a 2D-image averaging, and a 3D pixel interpolation from at least two 2D-images.

According to an example, the at least one 3D data fusion module S2.3 is configured to perform an operation selected from a group of operations including a 3D-image data stitching, a 3D data extrapolation, a 3D-object reconstruction, a 3D-conversion module and 3D display modules. A 3D-conversion module is configured to generate and store the 3D-volume image dataset VDS in a standardized format. A 3D display module is configured to perform an operation selected from a group of operations including of a display of 2D-intersections through the 3D-volume image dataset, a computation and a display of 3D-image projections, a rendering and a display of flight simulations through the 3D-volume image dataset VDS. In an example, the at least one 3D data fusion module S2.3 comprises a 3D-volume data fusion module and a 3D-conversion module.

According to an example, the at least one 3D-processing sub-step S2.4 is configured to perform an operation selected from a group of operations including 2D-intersection modules, 3D-volume object modules, 3D-object classification modules and metrology modules. 2D intersection modules are configured to perform an operation selected from a group of operations including a computation of a virtual 2D-intersection at arbitrary angles or positions within the 3D-volume image dataset, a detection and a classification of 2D-objects within a virtual 2D-intersection, and a determination of a parametrized description of a 2D-object.

3D-volume object operations are configured to perform an operation selected from a group of operations including a detection of 3D-volume objects and a determination of a parametrized description of a 3D-volume object. 3D-object classification operations are configured to classify and label 3D-volume objects within the 3D-volume image dataset VDS. Metrology operations are configured for determining at least one measure selected from a group including a position, a distance, an area, a volume, an angle, a material composition of at least one 2D-object or 3D-volume object within the 3D-volume image dataset VDS and/or to count instances of 2D-objects or 3D-volume objects within the 3D-volume image dataset VDS. In an example, the at least one 3D-processing module S2.4 comprises a 2D intersection module for generating a virtual 2D-intersection and a metrology module for determining a measure in the virtual 2D-intersection.

3D processing modules may include machine learning methods such as a volume object detector.

According to an example, the at least one extraction sub-step S2.5 is configured to perform an operation selected from a group of operations including data sorting operations, data analysis operations, and display operations. Data sorting operations are configured to perform data collection, data listing and data sorting operations of data from a group of data including the at least one property of a 2D-object determined by at least one 2D-processing module and the at least one attribute determined by at least one 3D-processing module. Data analysis operations are configured to perform an analysis selected from a group including a filter operation, a statistical operation, an analytical operation. Display operations are configured to perform a display operation selected from a group including a display of graphical representations of data, a display of graphical representations of results of data analysis modules, a display of 2D-intersections, a computation and a display of 3D-image projections, a computation and a display of exploded assembly drawings of 3D-volume objects, a rendering and a display of flight simulations through the 3D-volume image dataset VDS.

Generally, a data processing method P2 involves a plurality of 2D-images of an inspection volume of a wafer. A data processing method P2 however can further comprise a step of receiving further input such as template images of semiconductor objects of interest, for example for an object detector, Classifiers for example for a defect classification, CAD information including positional information and material compositions relating to semiconductor objects of interest, reference images obtained during previous inspections, position markings of features within the template images, the CAD information or the reference images, an input from a previous element of a workflow template, Trained machine learning methods.

The execution of the method steps of the first method or process P1 for acquiring the plurality of two-dimensional (2D) images and the second, a data processing method P2 for 3D data processing can be arranged sequentially but can also be performed at least partially in parallel. The first step S2.1 of the data processing method P2 can be initiated and executed as soon as the at least one two-dimensional image 2DI generated by the method P1 for acquiring the plurality of two-dimensional (2D) images is generated and available in memory M1. The second step S2.2 of the data processing method P2 can be initiated and executed as soon as the at least two two-dimensional images 2DI generated by the method P1 for acquiring the plurality of two-dimensional (2D) images are generated and available in memory M1.

Some examples of methods P1 for acquiring the plurality of two-dimensional (2D) images include an element for slicing and imaging within an inspection volume at slanted angle, as described above and in WO 2021/180600 A1, incorporated above;

an element for slicing and imaging within an inspection volume at at least one slanted angle with reduced number of cross sections, as described in U.S. Provisional application No. 63/291,569, field on Dec. 20, 2021, which is hereby incorporated by reference;

an element for fast image acquisition by interlaced imaging, fast image acquisition with frame averaging, limited imaging to small regions of interest or sparse imaging as described in U.S. provisional application No. 63/328,418, filed on Apr. 7, 2022, which is hereby incorporated by reference;

an element for changing an imaging with a charged particle beam imaging system into a high-resolution imaging mode with reduced working distance, as described in U.S. provisional application No. 63/265, 548 filed on May 31, 2022, which is hereby incorporated by reference;

a method of reducing image distortion by consideration of drifts of the dual beam system and limiting of an inspection volume as described in U.S. provisional application No. 63/424,133, filed on Nov. 9, 2022, which is hereby incorporated by reference.

an element of slicing and imaging with a predefined slicing thickness sequence, different slicing angles, an element for a mitigation of a curtaining effect during milling.

Switching from fast imaging (e.g. large pixel size, short dwell time) to high quality imaging when a structure of interest is recognized.

Some examples of data processing methods P2 include a feature-based alignment as for example described in WO 2020/244795 A1, which is hereby incorporated by reference;

a fiducial based alignment with at least two concentric alignment grooves as for example described in WO 2020/244795 A1, incorporated above an element for transferring alignment information from a first cross section image to a second cross section image, as for example described in WO 2022/096144 A1, which is hereby incorporated by reference;

an element of generating alignment features in proximity to an inspection volume and an element of performing an alignment via the generated alignment features as for example described in WO 2021/180600 A1, which is hereby incorporated by reference;

an element of determining a wafer tilt as described in U.S. application Ser. No. 17/496,345, filed on Oct. 7, 2021, which is hereby incorporated by reference;

an object detector for performing an object detection within a cross section image segment and later possibly a segmentation of the object, as for example described in WO 2022/223229 A1, which is hereby incorporated by reference;

an element for depth determination in cross section images at second semiconductor features of presumably known depth, as for example described in WO 2021/180600 A1 and incorporated above;

a method of image stitching for image segments obtained in different depths, as for example described in WO 2021/180600 A1 and incorporated above;

a distortion compensation as described in WO 2021/180600 A1 and incorporated above;

an element of alignment of a cross section image at an alignment fiducial within a confidence distance to a focal plane as described in US-application Ser. No. 17/522,167, filed on Nov. 9, 2021, which is hereby incorporated by reference;

an element for training image generation for training of a machine learning algorithm by physically inspired forward simulation as described in U.S. application Ser. No. 17/701,054, filed on Mar. 22, 2022, which is hereby incorporated by reference;

an element for a feature extraction in cross section images at anchor features as described in German patent application 102022211348.9, filed on Oct. 26, 2022, which is hereby incorporated by reference;

an element for determining of a statistical property of a plurality of features extracted from a plurality of cross section images as for example described in WO 2021/083581 A1, which is hereby incorporated by reference;

an element for a determination of a virtual cross section image as described in WO 2021/180600 A1 and incorporated above;

an element for determining an overlap area of a first semiconductor object of interest with a second semiconductor object of interest, as for example described in WO 2021/083551 A1, which is hereby incorporated by reference;

an element for a determination of an average semiconductor object of interest, for example of an HAR structure, as for example described in WO 2021/180600 A1 and incorporated above;

an element for a parametric approximation of a property of a semiconductor object of interest, such as an optimization of a parametrized trajectory of an HAR channel as described in U.S. provisional application No. 63/291,569, filed on Dec. 21, 2021, which is hereby incorporated by reference;

an optimization of parametrized cross section values of semiconductor objects of presumably known depth, as described in U.S. provisional application No. 63/292, 043, filed on Dec. 21, 2021, which is hereby incorporated by reference.

Figure 6:
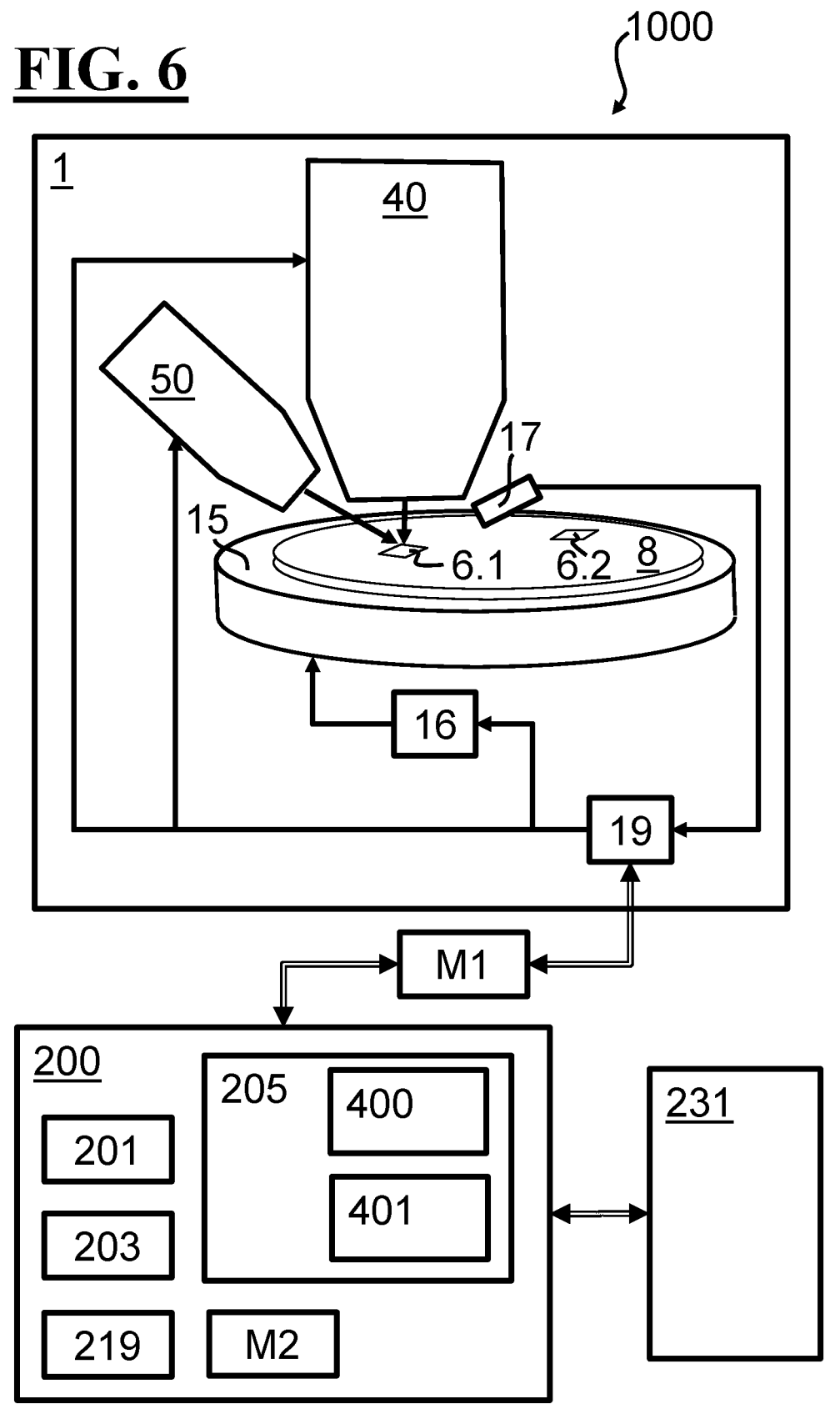

A 3D wafer inspection system 1000 configured for executing the method according to the first embodiment is described in the second embodiment. An example according to the second embodiment is illustrated in FIG. 6. The wafer inspection system 1000 comprises a dual beam system 1. A dual beam system 1 is illustrated in FIG. 1 with more detail and reference is made to the description of FIG. 1. Essential features of a dual beam system 1 are a first charged particle or FIB column 50 for milling and a second, charged particle beam imaging system 40 for high-resolution imaging of cross section surfaces. A dual beam system 1 comprises at least one detector 17 for detecting secondary particles, which can be electrons or photons. A dual beam system 1 further comprises a wafer support table 15 configured for holding during use a wafer 8. The wafer support table 15 is position controlled by a stage control unit 16, which is connected to the control unit 19 of the dual beam system 1. In an example, the method according to the first process P1 for acquiring the plurality of two-dimensional (2D) images is implemented as an executable software code and stored in an internal memory of the control unit 19. The control unit 19 is configured with internal memory and logic to control operation of the dual beam system 1 according to the first process P1 for acquiring the plurality of two-dimensional (2D) images and for storing the plurality of 2D images 2DI in memory M1.

In an example, the method according to the data processing method P2 is implemented as an executable software code and stored in an internal non-volatile memory 203 of a processing computer system 200 of the wafer inspection system 1000. The processing computer system 200 comprises at least one processing engine 201, which comprises multiple parallel processors including GPU processors and a common, unified memory. The processing computer system 200 further comprises a non-volatile memory M2 for storing standardized 2D-image dataset SDS and the 3D volume dataset VDS. The processing computer system 2 further comprises a user interface 205, comprising a user interface display 400 and user command devices 401, configured for receiving input from a user. The processing computer system 200 further comprises a memory or storage 219 for storing process information of the image generation process of the dual beam device 1 and for storing libraries of software instructions, which can be executed on demand by the processing engine 201. The process information of the image generation process with the dual beam device 1 can for example include a library of the effects during the image generation and a list of predetermined material contrasts. The software instructions comprise software modules for performing any module of a data processing method P2 according to the first embodiment.

The processing computer system 200 is further connected to an interface unit 231, which is configured to receive further commands or data, for example CAD data, from external devices or a network. The interface unit 231 is further configured to exchange information, for example to receive instructions from external devices or to provide measurement results to external devices. Dual beam system 1 and processing computer system 200 are both connected to parallel access memory M1 for storing and accessing 2D images 2DI.

Figure 7:
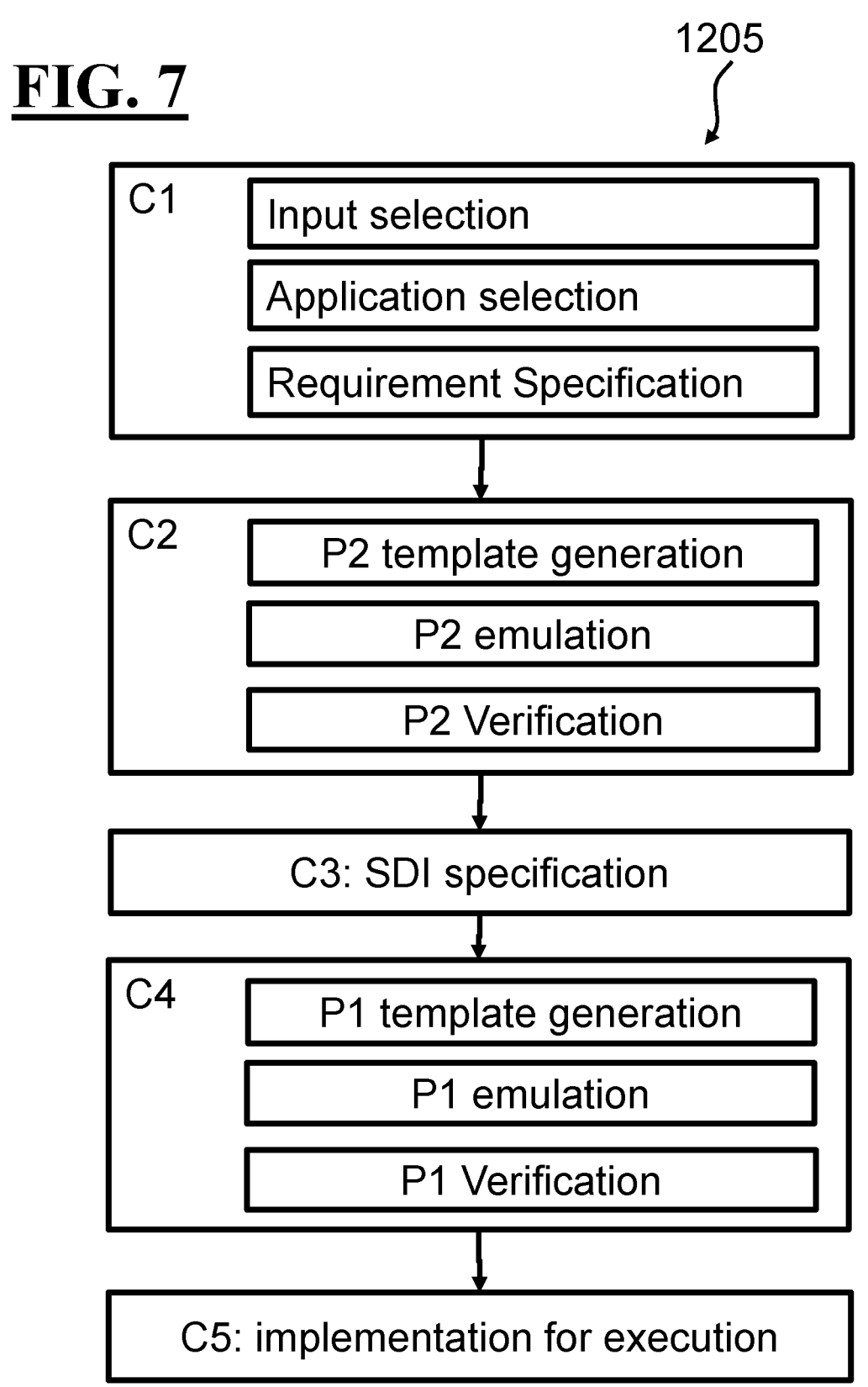
FIG. 7 illustrates a method of configuring a 3D inspection method.

A method of configuring a 3D-inspection method or workflow is provided in the third embodiment. An example of a method of configuring a 3D-inspection workflow 1205 is illustrated in FIG. 7. The method 1205 of configuring a 3D-inspection workflow comprises following steps:

a first configuration step C1 of specifying a 3D inspection task;

a second configuration step C2 for configuring a data processing method P2;

a third configuration step C3 for determining a specification of a plurality of two-dimensional images to be generated by a dual beam device with a slice-and imaging method;

a fourth configuration step C4 for configuring a method P1 for acquiring the plurality of two-dimensional (2D) images;

a fifth configuration step C5 of implementation at least one executable software code configured for parallel execution.

The first configuration step C1 comprises a specification of an input of two-dimensional image data 2DI; the input selection can comprise the selection of wafers or wafer samples and the selection of a dual-beam device for executing a method P1 for acquiring the plurality of two-dimensional (2D) images, for example by a slice-and image acquisition method.

In an example, the first configuration step C1 comprises the step of determining a selected input source, for example a memory M1, for receiving the plurality of two-dimensional images 2DI. The first configuration step C1 can comprise a step of displaying a list of input sources for receiving the plurality of two-dimensional images 2DI and a step of receiving a user instruction for determining the selected input source from the list of input sources.

The first configuration step C1 further comprises an application selection; here, the method comprises the receiving of a user selection of an application from a list of predefined 3D inspection task, for example a 3D defect inspection, a 3D investigation of a plurality of HAR channels of a memory device, a 3D investigation of a logic device, a 3D investigation of an overlay or a contact area, a 3D measurement of a measure as described above, or other applications.

The first configuration step C1 further comprises determining of a first specification of the selected application. For example, the first specification comprises specification of a resolution, an accuracy of an inspection result, a time interval for execution of the 3D inspection task, a specification of defect classes, or similar.

Configuration step C1 is configured to receive a user input or a user selection from a predefined list of options. In an example, configuration step C1 is configured to receive a user selection of a predefined 3D-inspection workflow. The first configuration step C1 is therefore comprising the steps of displaying a list of predefined 3D inspection tasks; receiving a user interaction for selecting a selected 3D inspection task from the list of predefined 3D inspection tasks; displaying at least one first specification parameter of the selected 3D inspection task; and receiving a user input for determining the at least one first specification parameter.

The second configuration step C2 comprises a template generation of a data processing method P2 for 3D-data processing. The template generation step comprises steps for receiving at least one user command for selection or change of individual method steps of the data processing method P2. In an example of the template generation step, a template is automatically generated based on the first specification of the 3D-inspection task according to configuration step C1. In an example, the template generation comprises steps for receiving at least one user command for selection or change of at least one individual method step from a pre-selected list of method step, wherein the pre-selection of method steps is automatically performed based on the first specification of the 3D-inspection task according to configuration step C1. Thereby, a template is modified and a modified template of a data processing method P2 for 3D-data processing is generated.

The second configuration step C2 further comprises an optional emulation of a template of the data processing method P2. The optional emulation can be performed by model-based simulation of the template of the data processing method P2, using predefined third specifications of the individual method steps of a data processing method P2. In an example, the optional emulation can be performed by using a representative plurality of two-dimensional images.

The second configuration step C2 further comprises an optional verification of the optionally modified template of the data processing method P2. With the verification it is ensured that a first specification according to configuration step C1 is achieved during execution of the optionally modified template of the data processing method P2.

The third configuration step C3 comprises automatically determining a second specification for a plurality of two-dimensional images 2DI. Given the first specification according to configuration step C1 and the verification of the optionally modified template of the data processing method P2 based on an emulation, a second desired property for the plurality of 2D-images is determined, for example from a predefined correspondence list of the modified template of data processing method P2 with 2DI-desired properties. The second specification comprise desired properties from a group of desired properties including a lateral resolution and image contrast;

an acceptable noise level;

a sampling distance of 2D-images perpendicular to an image plane of a 2D-image, corresponding to a milling thickness of a slice-and image method;

an inclusion of alignment marks or fiducials for lateral or 3D alignment and registration;

an image sampling strategy, for example including a limitation to regions of interest or a sparse image sampling strategy.

The fourth configuration step C4 is comprises a template generation of a template of a method P1 for acquiring the plurality of two-dimensional (2D) images. The template generation step comprises steps for receiving at least one user command for selection or change of individual method steps of the method P1 for acquiring the plurality of two-dimensional (2D) images. In an example of the template generation step, a template is automatically generated based on the specification of the second specification of the plurality of two-dimensional images according to configuration step C3. In an example, the template generation comprises steps for receiving at least one user command for selection or change of at least one individual method step from a pre-selected list of method step, wherein the pre-selection of method steps is automatically performed based on the second specification according to configuration step C3. Thereby, a template is modified and a modified template method P1 for acquiring the plurality of two-dimensional (2D) images is generated.

The fourth configuration step C4 further comprises an optional emulation of a template of the method P1 for acquiring the plurality of two-dimensional (2D) images. The optional emulation can be performed by model-based simulation, using predefined third specifications of the individual method steps of a method P1 for acquiring the plurality of two-dimensional (2D) images. In an example, the optional emulation can be performed by a using a virtual model of a semiconductor object of interest, for example derived from CAD data of a semiconductor object of interest.

The fourth configuration step C4 further comprises an optional verification of the optionally modified template of method P1 for acquiring the plurality of two-dimensional (2D) images. With the verification it is ensured that a second specification according to configuration step C3 is achieved during execution of the optionally modified template of the method P1 for acquiring the plurality of two-dimensional (2D) images.

A fourth configuration step C4 configured to configure a first method P1 for acquiring the plurality of two-dimensional (2D) images according to a desired property of the second, data processing method P2. A fourth configuration step C4 comprises the selection and configuration of a sequence of method steps for acquiring the plurality of two-dimensional (2D) images. The selection and configuration of the sequence comprises the selection and configuration of method steps from a group of method steps including the method steps described in the first embodiment.

In an example, a fourth configuration step C4 of the first method P1 for acquiring the plurality of two-dimensional (2D) comprises a step of selecting of operations according to predetermined performance limitations of certain operations. For example, for a slicing or imaging with the dual beam device, predetermined performance limitations are a minimal slicing thickness, an image resolution, an imaging contrast, image aberrations such as a distortion, a noise level or the like. A selection of method steps can further be determined according to constraints of certain method steps, such as volume constraints of a slicing or imaging with the dual beam device.

The fifth configuration step C5 comprises an implementation into at least one executable software code. For example, the implementation comprises a first implementation of a first executable software code of the first method P1 for acquisition the plurality of two-dimensional (2D) images configured for a dual beam controller 19 of a selected dual beam system 1 according input selection of configuration step C1. For example, the implementation comprises a second implementation of a second executable software code of the second, data processing method P2 for 3D-data processing configured for a processing computer system 200. The second implementation may comprise a linking to software libraries installed within the processing computer system 200 and dedicated for the use within processing computer system 200.

The implementation into at least one executable software code can be configured for a sequential arrangement but can also be configured for parallel execution, as described above at the first embodiment. The first step S2.1 of the data processing method P2 can configured to be triggered by each event of a new two-dimensional image 2DI generated and stored in memory M1 by the method P1 for acquiring the plurality of two-dimensional (2D) images. The second step S2.2 of the data processing method P2 can be configured to be triggered by each event of at least a second consecutive two-dimensional image 2DI generated and stored in memory M1 by the method P1.

According to a third embodiment, the method for generating a 3D-inspection workflow is therefore split into three major parts:

a first, user specification step C1 a second configuration step C2 for configuring a second, data processing method P2 and an extraction of an inspection result from a plurality of two-dimensional (2D) images of a semiconductor object of interest, and a fourth configuration step C4 configured to generate a first method P1 for acquiring the plurality of two-dimensional (2D) images according to a desired property of the second, data processing method P2.

Figure 8:
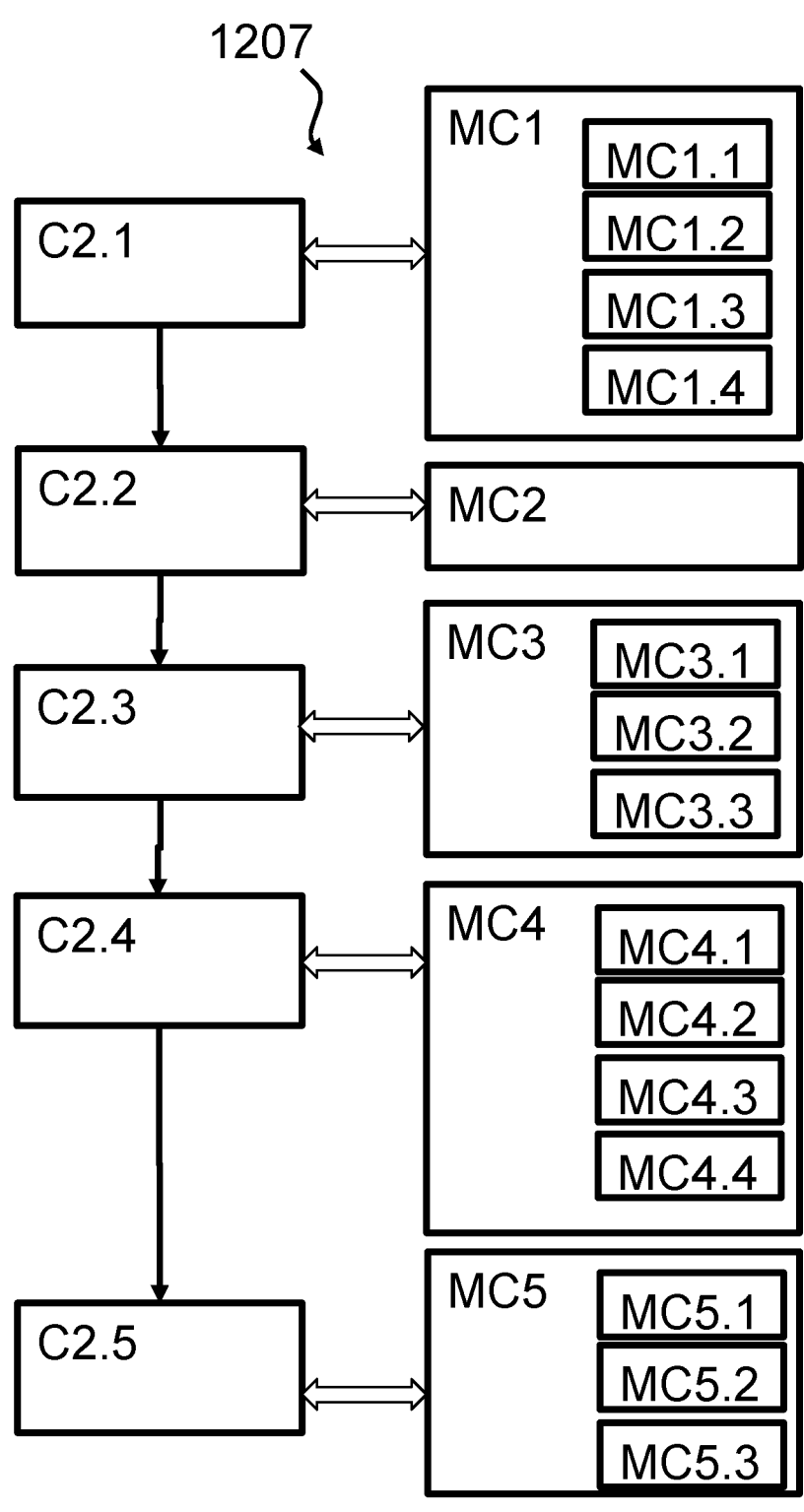
FIG. 8 illustrates a method of configuring a data processing method.

The second configuration step C2 comprises a method configured to generate the second, data processing method P2 including an extraction of an inspection result of a 3D-inspection task from a plurality of two-dimensional images of a 3D-semiconductor object of interest. The second configuration step C2 comprises the selection and configuration of a sequence of method steps from different modules of a data processing method. The selection and configuration of the method steps from the different modules is depending on an inspection task of a semiconductor object of interest. According to a fourth embodiment, a method for configuring a second, data processing method P2 for 3D-inspection of a 3D semiconductor object of interest from plurality of two-dimensional images 2DI is disclosed. An example of a method 1207 for configuring a second, data processing method P2 is illustrated in FIG. 8.

The method for configuring a second, 3D data processing method P2 comprises a first step C2.1 of selecting at least one 2D-processing operation or module from a first class of modules MC1 for generating a standardized 2D-image dataset SDS from a plurality of two-dimensional images SDI.

In an example, the method for configuring a second, data processing method P2 further comprises a second step C2.2 of selecting at least one 2.5D data fusion operation or module from a second class of modules MC2.

The method for configuring a second, data processing method P2 further comprises a third step C2.3 of selecting at least one data fusion module from a third class of modules MC3 for generating a 3D-volume dataset VDS from the standardized 2D-image dataset SDS.

The method for configuring a second, data processing method P2 further comprises a fourth step C2.4 of selecting at least one 3D-processing module from a fourth class of modules MC4 for determining at least one attribute of a 3D-semiconductor object of interest. The at least one attribute is selected from a group including a classification label, a measure, a descriptive parameter of a parametrized description of a 2D-object or 3D-volume object within the 3D-volume dataset VDS.

The method for configuring a second, data processing method P2 further comprises a fifth step C2.5 of selecting at least one extraction operation or module from a fifth class of modules MC5 for extraction and display of an inspection result comprising the at least one attribute.

Figure 9:
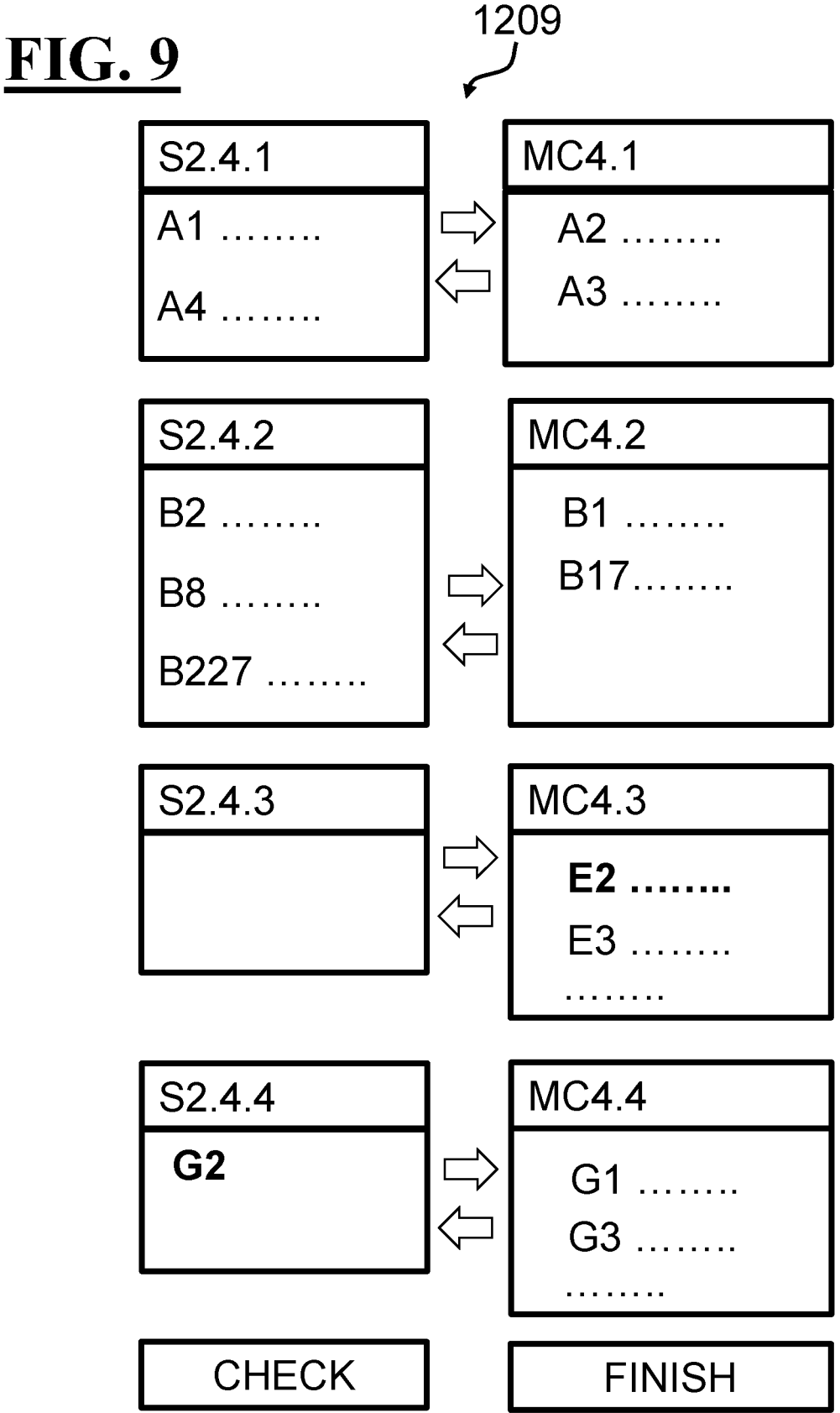
FIG. 9 illustrates an example of a user interface for selecting of method steps of a data processing method.

In an example, the method for configuring a second, data processing method P2 for 3D-inspection of a 3D semiconductor object of interest from plurality of two-dimensional images 2DI comprises a step of displaying a list of operations or modules of at least one class of modules MCi (with i=1 . . . 5) and for receiving a user interaction of a selection of a module from a class of modules MCi. An example of a user interface configured for configuration step 1209 of configuration step C2.4 is illustrated in FIG. 9. The selection of 3D-processing modules according to step C2.4 from the fourth class of modules MC4 comprises a selection from 3D-processing modules selected from a group including 2D-intersection modules MC4.1, 3D-volume object modules MC4.2, 3D-object classification modules MC4.3 and metrology modules MC4.4.

2D intersection modules MC4.1 are configured to perform an operation selected from a group of operations including a computation of a virtual 2D-intersection at arbitrary angles or positions within the 3D-volume image dataset, a detection and a classification of 2D-objects within a virtual 2D-intersection, a determination of a parametrized description of a 2D-object. In this example, two method steps A1 and A4 are selected for step S2.4.1 of a 3D-data processing method P2 (see for reference the first embodiment and FIG. 5). For example, an operation A1 configured for a computation of a virtual 2D-intersection and an operation A4 configured for a determination of a parametrized description of a 2D-object A4 are selected for step S2.4.1.

3D-volume object modules MC4.2 are configured to perform an operation selected from a group of operations including a detection of 3D-volume objects, and a determination of a parametrized description of a 3D-volume object. In the example illustrated in FIG. 9, three method steps B2, B8 and B227 are selected for step S2.4.2 of a 3D-data processing method P2 (see for reference the first embodiment and FIG. 5). For example, an operation B2 configured for a first detection of first 3D-volume objects, an operation B8 configured for a second detection of second 3D-volume objects, and an operation B227 configured for a determination of a parametrized description of the second a 3D-volume object is selected for step S2.4.2.

3D-object classification modules MC4.3 are configured to classify and label 3D-volume objects within the 3D-volume image dataset. In the example illustrated in FIG. 9, no method step is selected for step S2.4.3 of a 3D-data processing method P2 (see for reference the first embodiment and FIG. 5). In this example, a recommended operation E2 is highlighted in the display of 3D-object classification modules MC4.3 for a recommended user selection. Recommended modules or operations can be determined according to correspondence or correlation lists, which comprise a predetermined recommendation of certain operation or method steps from the modules depending on a 3D-inspection task or a specification of an inspection result as for example configured during a step C1. A predetermined recommendation of certain operation or method steps can also be determined according to other selected method steps from the same or other modules MCi of operations.

Metrology modules MC4.4 are configured for determining at least one measure selected from a group including a position, a distance, an area, a volume, an angle, a material composition of at least one 2D-object or 3D-volume object within the 3D-volume image dataset and/or to count instances of 2D-objects or 3D-volume objects within the 3D-volume image dataset. In the example illustrated in FIG. 9, an operation G2 is automatically selected for step S2.4.4 of a 3D-data processing method P2 (see for reference the first embodiment and FIG. 5). In this example, an automatically selected operation G2 is highlighted in the display of metrology modules MC4.4.

After the configuration of steps S2.4.1 to S2.4.4, an automatic consistency check can be requested by user interaction or a configuration step C2.4 can be terminated by user selection of label FINISH.

In an example, the recommendation for selecting of at least one 3D-processing module in step C2.4 comprises the selection of a 2D intersection module from modules MC4.1 and a metrology module from modules MC4.4.

The user selection of the other configurations steps C2.1, C2.2, C2.3 and C2.5 can be configured in similar way to the example for configuration step C2.4, as illustrated in FIG. 9. The selection of at least one 2D-processing module during step C2.1 comprises the selection of modules from the first class of modules MC1 including image registration modules MC1.1, image processing modules MC1.2, image analysis modules MC1.3 and image conversion modules MC1.4. Image registration modules MC1.1 are configured to perform an image registration operation selected from a group including an alignment of a 2D-image in a 3D-coordinate system, an adjustment of an image magnification, or a compensation of a distortion. Image processing modules MC1.2 are configured to perform an image processing operation selected from a group including a filter operation, a convolution, a morphologic operation, a contour enhancement, a noise reduction, a threshold operation, and a brightness or contrast adjustment. Image analysis modules MC1.3 are configured to perform an image analysis operation selected from a group including detection and classification of 2D-objects, a determination of a parametrized description of a 2D-object, a determination of at least one property of a 2D-object, determination of a depth map of the 2D-image. Image conversion modules MC1.4 are configured to perform an image conversion operation of an input format of the 2D-image dataset into a standardized format of the standardized 2D-image dataset SDS. In an example, the selecting of at least one 2D-processing module comprises the selection of three modules, including the selection of an image registration module from modules MC1.1, an image analysis module from modules MC1.3, and an image conversion module from modules MC1.4.

The second class of modules MC2 comprises 2.5D data fusion modules, configured to perform an operation selected from a group of operations including a 2D-image-to-image alignment, a 2D-image averaging, and a 3D pixel interpolation from at least two 2D-images.

The third class of modules MC3 comprises data fusion modules selected from a group including 3D-volume data fusion modules MC3.1, 3D-conversion modules MC3.2, and 3D-display modules MC 3.3. 3D-volume data fusion modules MC3.1 are selected form a group of modules configured to perform an operation selected from a group of operations including 3D-image data stitching, 3D data extrapolation, 3D-object reconstruction. 3D-conversion modules MC3.2 are selected form a group of modules configured to generate and store the 3D-volume data in a standardized 3D-volume dataset (VDS). 3D-display modules MC3.3 are selected form a group of modules configured to perform an operation selected from a group of operations including display of 2D-intersections through the 3D-volume dataset VDS, a computation and a display of 3D-image projections, a rendering and a display of flight simulations through the 3D-volume dataset VDS.

In an example, the recommendation of a selection of at least one data fusion module in step C2.3 from modules MC3 comprises the recommendation of a selection of at least one 3D-volume data fusion module from modules MC3.1 and a 3D-conversion module from modules MC3.2.

The fifth step C2.5 of selecting at least one extraction module from a fifth class of modules MC5 comprises extraction modules selected from a group including data sorting modules MC5.1, data analysis modules MC5.2, and display modules MC5.3. Data sorting modules MC5.1 are configured to perform data collection, data listing and data sorting operations of data from a group of data including the at least one property of a 2D-object determined by at least one 2D-processing module and the at least one attribute determined by at least one 3D-processing module. Data analysis modules MC5.2 are configured to perform an analysis selected from a group including a filter operation, a statistical operation, an analytical operation. Display modules MC5.3 are configured to perform a display operation selected from a group including display of graphical representations of data, display of graphical representations of data results of data analysis modules, display of intersections, computation and display of 3D-image projections, computation and display of exploded assembly drawings of 3D-volume objects, rendering and display of flight simulations through the 3D-volume image dataset.

In an example, the method 1207 for configuring a second, data processing method P2 for 3D-inspection of a 3D semiconductor object of interest from plurality of two-dimensional images 2DI comprises a step of automatically preselecting at least one operation from the 2D-processing module MC1, at least one operation from data fusion modules MC3, the at least one operation from 3D-processing modules MC4 and at least one operation from extraction modules MC5, wherein the preselection of operations is determined according to a selected inspection task and at least one specification parameter. The automatically preselected operations are either highlighted for user selection or automatically preselected for a method step S2.*i*.

In an example, the method 1207 for configuring a second, data processing method P2 for 3D-inspection of a 3D semiconductor object of interest from plurality of two-dimensional images 2DI according to the fourth embodiment comprises a step for generating of training images and a step for training of a machine learning network for example for an object detector or a deep learning method for a metrology task as described in described in U.S. application Ser. No. 17/701,054, filed on Mar. 22, 2022, incorporated above. In an example, the method 1207 for configuring a second, data processing method P2 comprises a step for receiving training images for training a machine learning algorithm. In an example, the method 1207 for configuring a second, data processing method P2 is therefore configured to include the trained machine learning algorithm in the configuration and implementation of the second, data processing method P2. In an example, the method 1207 for configuring a second, data processing method P2 is configured for training a machine learning algorithm for execution of a hardware-implemented machine learning method, as described in German patent application 102022124580.2 filed on Sep. 23, 2022, which is hereby incorporated by reference.

Figure 10:
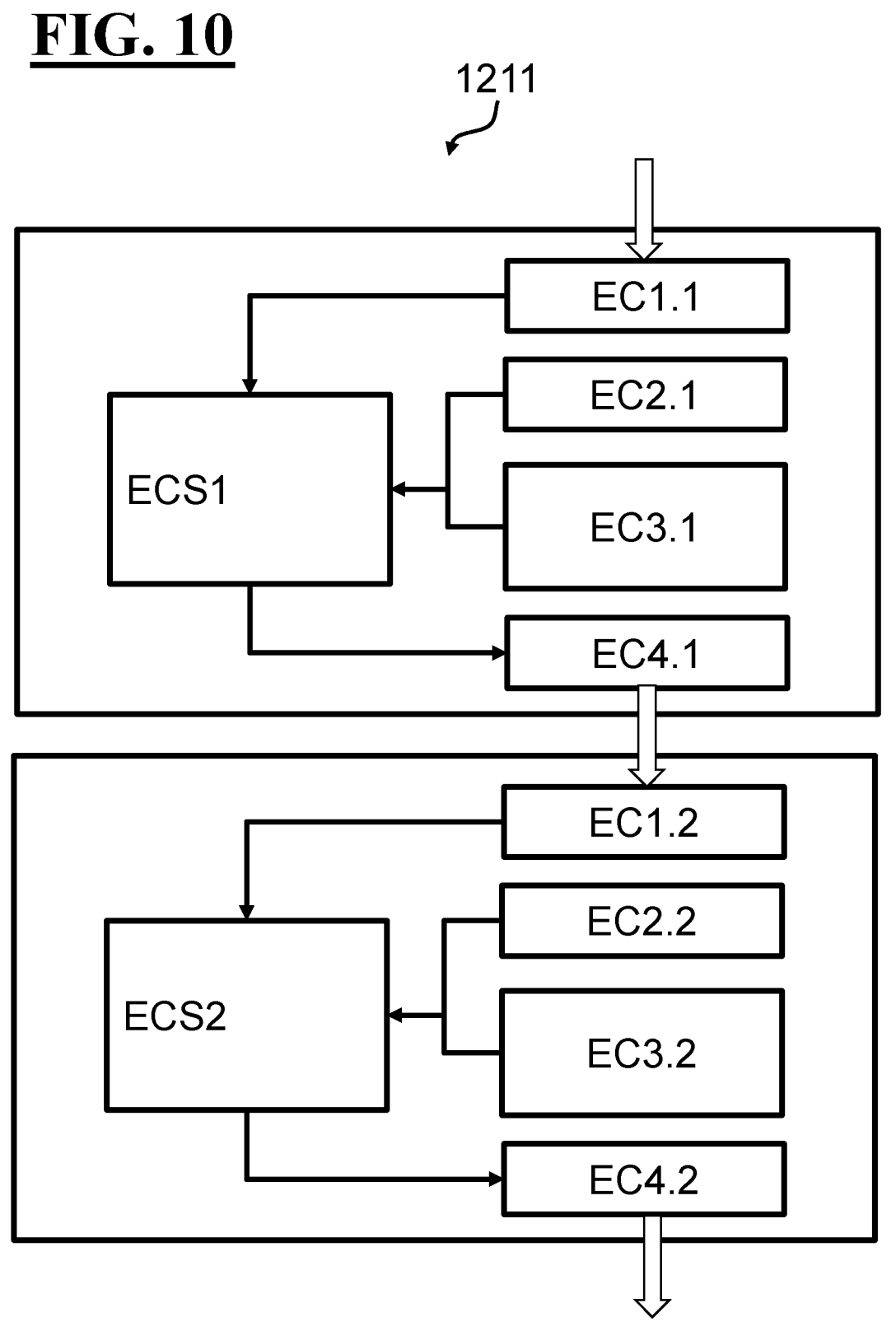

Each selected module or element of a data processing method P2 according to a method 1207 for configuring the second, data processing method P2 typically involves at least one member of a group of specifications including an input specification, a performance specification, a method specification, and an output specification. In an example, a method 1207 for configuring the second, data processing method P2 is therefore comprising a further step of specifying at least one selected module or element, selected and arranged for example by a configuration step C2.1 to C2.5 of the method 1207 for configuring the second, data processing method P2. The selected modules or elements are for example the method steps or operations A1, A4, B2, B8, B227, and G2 of a data processing method P2, as illustrated in FIG. 9. An example of a step 1211 of specifying at least one selected module or element is illustrated in FIG. 10. A first selected element ECS1 is specified by at least one input specification EC1.1 and at least one output specification EC4.1. A second, subsequent selected element ECS2 is specified by at least one input specification EC1.2 and at least one output specification EC4.2. For consistency of the configured data processing method P2 comprising first selected element ECS1 and second, subsequent selected element ECS2, the output specification EC4.1 of the first selected element ECS1 is consistent with input specification EC1.2 of the second, subsequent selected element ECS2. In an example, the step of specifying at least one selected element comprises a step of automatically determining of a consistent pair of specifications comprising an input specification EC1.2 of the second, subsequent selected element ECS2 and an output specification EC4.1 of a first selected element ECS1.

In an example, each selected module or element ECSi is further specified by at least one module performance specification EC2.*i* (with i=1 or 2 in FIG. 10). Performance specifications are for example given by an alignment or registration accuracy, an accuracy of a depth map computation, a minimum number of measurements for statistical evaluation, a polynomial degree of a parametric description of a semiconductor object of interest, and the like. In some examples, a selected element ECSi is further specified by at least one method specification. A method specification is for example given by a selection of a numerical method, a selection of an algorithm from a list of optional numerical methods or algorithms. In an example, the step of specifying at least one selected element comprises a step of automatically determining at least one member of a group of specifications from predetermined specifications of each selected element. Such predetermined specifications can be included in look-up tables or specified in an implementation of a selected element. In an example, the step of specifying at least one selected element comprises a step of receiving a user interaction for determining at least one specification.

Figure 11:
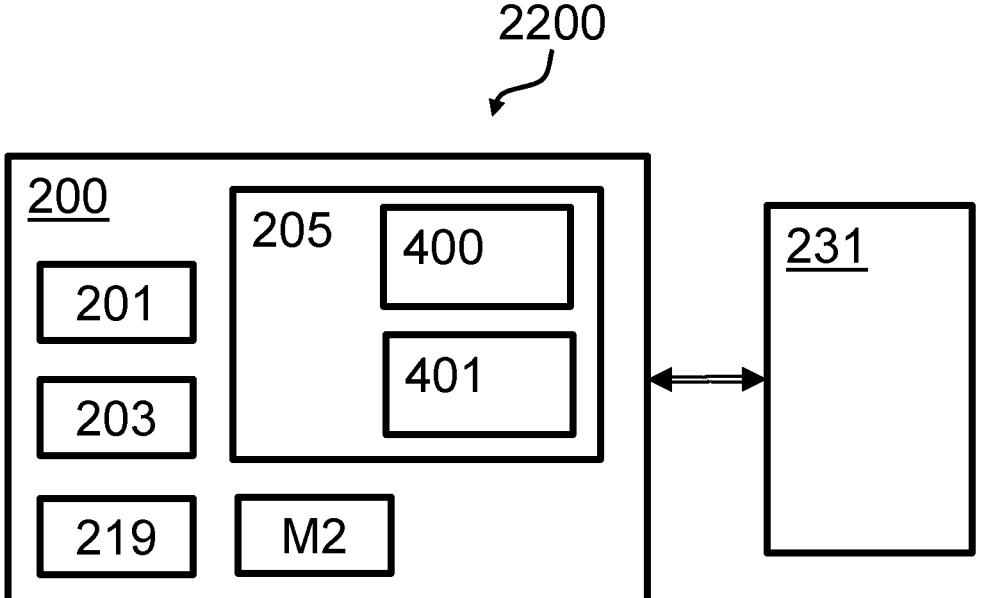
FIG. 11 illustrates a stand-alone workflow builder

According to a fifth embodiment, a workflow builder configured for executing the configuration method 1205 according to a third or fourth embodiment is disclosed. In an example, a workflow builder comprises the same elements and is corresponding to the processing computer system 200 illustrated in FIG. 6. A stand-alone example of a workflow builder 2200 is illustrated in FIG. 11. A workflow builder 200, 2200 comprises a processing engine 201 configured to execute a method for configuring a 3D-inspection task. The workflow builder 200, 2200 comprises a user interface 205 and software instructions that guides the user in creating or configuring a 3D inspection tasks with minimal expertise. An example of a display at graphical display 400 of user interface 205 configured for user configuration 1209 of configuration step C2.4 is illustrated in FIG. 9. A workflow builder 200, 2200 is generally configured for a repeated configuration of pre-defined templates of 3D-volume inspection methods 1101 and modification of 3D-volume inspection methods 1101 to create new or customized 3D-volume inspection methods 1101. In an example, the workflow builder 200, 2200 is configured to perform a workflow emulation and to perform a performance verification for example at a set of 2D test images or by performing the configured workflow method at a test wafer.

The configuration methods 1205, 1207, 1209 and 1211 according to the third and fourth embodiments and the workflow builder 200, 2200 according to the fifth embodiment are configured to fill the gap between inline inspection or routine tools, which are dedicated to repeat the same task during a fabrication of semiconductor wafers without any user interaction, and scientific research tools, which can be operated in scientific research environments by highly skilled researchers. The configuration methods 1205, 1207, 1209 and 1211 according to the third and fourth embodiments and the workflow builder 200, 2200 according to the fifth embodiment enables a user to generate high-performance workflows 1101 for 3D-volume inspection tasks within inspection volumes of semiconductor wafers with reduced training or expert knowledge. The configuration methods 1205, 1207, 1209 and 1211 according to the third and fourth embodiments and the workflow builder 200, 2200 according to the fifth embodiment enables a user to generate or adjust high-performance workflows 1101 with reduced training or expert knowledge. The configuration methods 1205, 1207, 1209 and 1211 according to the third and fourth embodiments and the workflow builder 200, 2200 according to the fifth embodiment further enables a user to configure or adjust a high-performance operation workflow P1 of a dual beam device of high complexity. The configuration methods 1205, 1207, 1209 and 1211 according to the third and fourth embodiments and the workflow builder 200, 2200 according to the fifth embodiment is configured to guide a user through the configuration of the individual elements of a workflow template. In an example, the configurations of the elements are set to preset values, and the configuration methods 1205, 1207, 1209 and 1211 according to the third and fourth embodiments and the workflow builder 200, 2200 according to the fifth embodiment are configured to guide the user through essential and missing configurations only, for example the step of providing CAD information or template images, which are specific for a selected 3D inspection task. Thereby, the configuration methods 1205, 1207, 1209 and 1211 according to the third and fourth embodiments and the workflow builder 200, 2200 according to the fifth embodiment are configured to reduce a knowledge level or a comprehensive experimentation for the development of a workflow 1101. In an example, the configuration methods 1205, 1207, 1209 and 1211 according to the third and fourth embodiments and the workflow builder 200, 2200 according to the fifth embodiment are configured to generate a sequence of elements of a method P1 for performing a slice-and image operation by a dual beam device 1, including the control parameters for the dual beam device 1 and generating of a plurality of 2D images 2DI obtained with the dual beam device 1. By limiting the functional modules and elements to those used for 3D-volume inspection in semiconductor wafers with a dual beam device 1 under slanted milling angle, a generation of workflow P1 including user change selections are enabled with reduced complexity. In an example, the configuration methods 1205, 1207, 1209 and 1211 according to the third and fourth embodiments and the workflow builder 200, 2200 according to the fifth embodiment are configured to generate a sequence of elements of a 3D data processing method P2, including a processing of the plurality of 2D images 2DI obtained with the dual beam device 1, and an extraction of inspections results of a 3d inspection task. By limiting the functional modules and elements to those used for 3D-volume inspection in semiconductor wafers, a generation of workflow templates including user change selections are enabled with reduced complexity.

Some examples of the disclosure can be described by following clauses. The disclosure is however not limited by the clauses and modifications are possible as well.

Clause 1: A method of 3D-inspection of a semiconductor object, comprising a first step P1 for acquiring a plurality of two-dimensional images 2DI from an inspection volume of a semiconductor object according to a predetermined specification, a second, 3D data processing step P2, wherein the first step P1 comprises at least one monitoring sub-step S1.5 comprising evaluating at least one two-dimensional image from the plurality of two-dimensional images 2DI and determining whether the at least one two-dimensional image is in conformity with the predetermined specification.

Clause 2: The method of clause 1, wherein the first step P1 further comprises at least one sub-step S1.1 selected from a group of method steps including method steps for a selection of an inspection site on a wafer and a selection of an inspection sample piece, at least one sub-step S1.2 selected from a group of method steps including method steps for a configuration of an inspection volume, a lateral resolution, a milling distance, at least one sub-step S1.3 selected from a group of method steps including method steps for forming alignment markers or fiducials close to or within the inspection volume, at least one sub-step S1.4 selected from a group of method steps including method steps for an iterative sequence of milling and imaging, at least one sub-step S1.6 selected from a group of method steps including method steps of writing the plurality of two-dimensional images 2DI into a common access memory M1.

Clause 3: The method of clause 1 or 2, wherein the predetermined specification is a specification of the second 3D data processing step P2.

Clause 4: The method of any of the clauses 1 to 3, wherein the at least one monitoring sub-step S1.5 comprises selecting or discarding at least one of the plurality of two-dimensional images 2DI.

Clause 5. The method of any of the clauses 1 to 4, wherein the at least one monitoring sub-step S1.5 comprises flagging of image regions of the at least one of the plurality of two-dimensional images 2DI, which are not in conformity with the predetermined specification.

Clause 6. The method of any of the clauses 1 to 5, wherein evaluating the at least one of the plurality of two-dimensional images 2DI comprises evaluating an image property selected from a group of image properties including an image contrast, an image resolution, a presence of specific features within a 2D image, an accuracy of an image of a fiducial or alignment marker Clause 7. The method of any of the clauses 1 to 6, further comprising, based on the at least one monitoring sub-step S1.5, triggering an adjustment from a group including a re-alignment of a wafer or a wafer sample by a wafer stage;

an adjustment of an imaging parameter of a charged particle beam imaging system, for example a focus adjustment, an increase of a dwell time, or a compensation of an aberration of the charged particle beam imaging system;

an adjustment of a milling angle or a milling range of a focused ion beam.

Clause 8. The method of any of the clauses 1 to 7, comprising triggering a repetition of an image acquisition of a two-dimensional image if the two-dimensional image is not in conformity with the predetermined specification.

Clause 9. The method any of the clauses 1 to 8, wherein the second, 3D data processing method P2 comprises receiving the plurality of two-dimensional images 2DI from the common access memory M1, extracting a 3D inspection result from the two-dimensional images 2DI.

Clause 10. The method of clause 9, wherein the second 3D data processing method P2 comprises at least one 2D-processing sub-step S2.1 for generating a standardized 2D-image dataset SDS from the plurality of two-dimensional images 2DI.

Clause 11. The method of clause 10, wherein the second 3D data processing method P2 comprises at least one 2.5D data fusion sub-step S2.2 for modifying the standardized 2D-image dataset SDS.

Clause 12. The method of clause 10 or 11, wherein the second 3D data processing method P2 comprises at least one 3D-data fusion sub-step S2.3 for generating a 3D-volume image dataset VDS from the standardized 2D-image dataset SDS.

Clause 13. The method of clause 12, wherein the second 3D data processing method P2 comprises at least one 3D-processing sub-step S2.4 for determining at least one attribute of a 3D-semiconductor object of interest included within the 3D-volume image dataset VDS.

Clause 14. The method of clause 13, wherein the at least one 3D-processing sub-step S2.4 comprises at least one operation selected from a group of operations including 2D-intersection operations, 3D-volume object operations, 3D-object classification operations and metrology operations.

Clause 15. The method of clause 13 or 14, wherein the second 3D data processing method P2 comprises at least one extraction sub-step S2.5 for extraction, display and storing of an inspection result IR from the at least one attribute.

Clause 16. The method of clause 15, wherein the at least one extraction sub-step S2.5 comprises at least one operation selected from a group of operations including data sorting operations, data analysis operations, and display operations.

Clause 17. The method any of the clause 1 to 16, wherein at least one sub-step of each of the first step P1 for acquiring a plurality of two-dimensional images 2DI and the second, 3D data processing step P2 are performed at least partially in parallel.

Clause 18. A system (1000) for 3D wafer inspection, comprising a dual beam system (1) including a first charged particle or FIB column (50) for milling of at least one cross-section surface through an inspection volume in of a wafer (8), and a second, charged particle beam imaging system (40=for high-resolution imaging of the at least one cross section surface, a wafer support table (15), configured for holding during use a wafer (8)

a control unit (19) a first internal memory and logic configured to control an operation of the dual beam system (1) according to a first method for acquiring a plurality of two-dimensional images 2DI of clause 1; and a processing system (200), configured with a second internal memory at least one processing engine (201) configured for execution of the second, 3D data processing step P2 of clause 1.

Clause 19. A method of configuring a 3D-inspection workflow according to any of the clauses 1 to 17, comprising a first, user specification step C1 of specifying a 3D inspection task, a second, configuration step C2 of configuring a 3D data processing method P2, a third step C3 of determining at least one specification of a plurality of two-dimensional images 2DI to be generated by a dual beam device with a slice-and imaging method, a fourth, configuration step C4 for configuring a method P1 for acquiring the plurality of two-dimensional images 2DI to reach the specification, a fifth, configuration step C5 of implementation at least one executable software code for parallel execution.

Clause 20. The method of clause 19, wherein the second configuration step C2 comprises configuring a sub-step of extracting an inspection result from the plurality of two-dimensional images 2DI of a semiconductor object of interest.

Clause 21. The method of clause 19 or 20, further comprising generating a template of the second, 3D-data processing step P2 for 3D-data processing, and an emulation of the template by a simulation method selected from a group including a model-based simulation, by a simulation using a representative plurality of two-dimensional test images, and verifying that a first specification according to configuration step C1 is achieved during execution of the template of the second, 3D-data processing step P2.

Clause 22. The method of any of the clauses 19 to 21, wherein the at least one specification of the plurality of two-dimensional images 2DI is selected from a group of properties including a lateral resolution and image contrast;

an acceptable noise level;

a sampling distance of 2D-images perpendicular to an image plane of a 2D-image, corresponding to a milling thickness of a slice-and image method;

an inclusion of alignment marks or fiducials for lateral or 3D alignment and registration;

an image sampling strategy, for example including a limitation to regions of interest or a sparse image sampling strategy.

Clause 23. The method of any of the clauses 19 to 22, wherein the fourth configuration step C4 comprises selecting at least one operation according to a predetermined performance limitation or constraint of the operation.

Clause 24. The method of any of the clauses 19 to 23, wherein the fifth configuration step C5 comprises implementing of a first executable software code of the first step P1 into a controller 19 of a dual beam device 1 and implementing a second executable software code of the second, 3D data processing step P2 for 3D-data into a processing computer system 200.

Clause 25. A method of configuring a 3D data processing method P2 for 3D-inspection of a 3D semiconductor object of interest from a plurality of two-dimensional images 2DI, comprising:

selecting at least one 2D-processing module from a first class of modules MC1 for generating a standardized 2D-image dataset SDS from a plurality of two-dimensional images 2DI;

selecting at least one 3D data fusion module from a third class of modules MC3 for generating a 3D-volume image dataset VDS from the standardized 2D-image dataset;

selecting at least one 3D-processing module from a fourth class of modules MC4 for determining at least one attribute of a 3D semiconductor object of interest;

selecting at least one extraction module from a fifth class of modules MC5 for extraction and display of an inspection result from the at least one attribute.

Clause 26. The method of clause 25, comprising selecting at least one 2D-processing module from a first class of modules MC1 including image registration modules, image processing modules, image analysis modules and image conversion modules.

Clause 27: The method of clause 25 or 26, comprising selecting at least one 3D-data fusion module from a third class of modules MC3 including 3D-volume data fusion modules, a 3D-conversion module, and 3D-display modules.

Clause 28: The method of any of the clause 25 to 27, comprising selecting at least one 3D-processing module from a fourth class of modules MC4 including 2D-intersection modules, 3D-volume object modules, 3D-object classification modules and metrology modules.

Clause 29. The method of any of the clause 25 to 28, comprising selecting at least one extraction module from a fifth class of modules MC5 including data sorting modules, data analysis modules, and display modules.

Clause 30. The method of any of the clause 25 to 29, comprising selecting at least one 2.5D data fusion module from a second class of modules MC2.

Clause 31. The method of clause 30, comprising selecting at least one 2.5D data fusion module from a second class of modules MC2 including modules for 2D-image-to-image alignment, a 2D-image averaging, and a 3D pixel interpolation from at least two two-dimensional-images.

Clause 32. The method of any of the clause 25 to 31, comprising displaying a list of predefined inspection tasks receiving a user input of a selection of an inspection task from the list of predefined inspection tasks;

displaying at least one specification of the inspection result of the selected inspection task;

receiving a user input of the at least one specification of the inspection result.

Clause 33. The method of clause 32, wherein receiving the at least one specification of the inspection result comprises receiving a specification of the at least one attribute from a group of attributes including of a classification label, a measure, a descriptive parameter of a parametrized description of a 2D-object or 3D-volume object.

Clause 34. The method of clause 32 or 33, comprising displaying a list of modules of at least one class of modules MCi (with i=1 . . . 5);

pre-selecting at least one module of the at least one class of modules MCi for recommended user selection according to the specification of the inspection result or other, previously selected modules;

receiving a user interaction of a selection or confirmation of a selected module.

Clause 35. The method of clause 34, comprising specifying at least one selected module, comprising specifying at least one input specification;

specifying at least one output specification.

Clause 36. The method of clause 34 or 35, comprising specifying at least one output specification of a selected module according to an input specification of a subsequent module.

Clause 37. The method of any of the clauses 34 to 36, comprising specifying at least one module performance specification selected from a group of specifications including an alignment or registration accuracy, an accuracy of a depth map computation, a minimum number of measurements for statistical evaluation, a polynomial degree of a parametric description of a semiconductor object of interest.

Clause 38. The method of any of the clauses 34 to 37, comprising specifying at least one method of the selected module selected from a group of methods including a numerical method or an algorithm from a list of optional numerical methods or algorithms.

Clause 39. The method of any of the clauses 25 to 38, comprising receiving a user instruction for specifying an input source for receiving the plurality of two-dimensional images 2DI.

Clause 40. The method of any of the clauses 25 to 39, comprising generating an executable software code of the data processing workflow;

storing the executable software code in a non-volatile memory.

Clause 41. A dual beam charged particle beam apparatus (1000) for wafer inspection, comprising a focused ion beam system (FIB) and a scanning electron microscope (SEM), further comprising a computer system configured for execution of a method of configuring a 3D data processing method P2 for 3D-inspection of a 3D semiconductor object of interest from a plurality of two-dimensional images 2DI according to clause 25.

Clause 42. A method of 3D wafer inspection, comprising:

receiving a plurality of two-dimensional images 2DI comprising at least one 2D-image from at least one cross-section through a semiconductor wafer;

configuring a 3D data processing workflow according to clause 25;

executing the 3Ddata processing workflow on the plurality of two-dimensional images 2DI.

Clause 43. The method of clause 42, further comprising milling at least one cross-section surface with a focused ion beam system (FIB) into a semiconductor wafer at an angle>10° to the surface of a semiconductor wafer;

forming at least one 2D-image from the at least one cross-section surface with a scanning electron microscope (SEM);

forming the plurality of two-dimensional images 2DI from the at least one 2D-image.

Clause 44. The method of clause 42, comprising milling a plurality of N cross-section surface with a focused ion beam system (FIB) into a semiconductor wafer at an angle>10° to the surface of a semiconductor wafer;

forming a plurality of M two-dimensional-images from the plurality of N cross-section surfaces with a scanning electron microscope (SEM), wherein M<=N and N>1.

Clause 45. The method of configuring a 3D-inspection workflow according to clause 19, comprising the method of configuring a 3D data processing method P2 according to clause 25.

A LIST OF REFERENCE NUMBER IS PROVIDED

1 Dual Beam system
4 cross sections of HAR structures
6 measurement sites
8 wafer
15 wafer support table
16 stage control unit
17 Secondary Electron detector
19 Dual Beam Controller
40 charged particle beam (CPB) imaging system
42 Optical Axis of imaging system
43 Intersection point
44 Imaging charged particle beam
46 Axial gap lens
48 Fib Optical Axis
50 FIB column
51 focused ion beam
52 actual cross section surface
53 cross section surface
55 wafer top surface
155 wafer stage
160 inspection volume
200 Processing computer system
201 processing engine
203 memory
205 User interface
219 memory
231 Interface unit
307 cross section image of HAR structure
311 cross section image slice
313 word lines
315 edge with surface
400 user interface display
401 user command devices
1000 Wafer inspection system
1101 Workflow sequence
1103 Feedback loop
1105 list of optional method steps
1107 selected method steps
1111 user interface
1200 Workflow configurator interface
1205 method of configuring a 3D-inspection method
1207 method of configuring a 3D-data processing method
1209 user interface of a configuration step
1211 user interface for a configuration of a workflow element
2200 workflow builder

What is claimed is:

1. A computer-implemented method, comprising:
a) milling, with a dual beam system, a volume of a semiconductor object to provide an exposed surface of the semiconductor object;
b) acquiring, with a dual beam system, according to a predetermined specification a two-dimensional image, of the exposed surface of the semiconductor object;
c) evaluating, by a control unit of the dual beam device, the two-dimensional image, using a trained machine learning method to determine that whether the two-dimensional image conforms with a predetermined specification;

d) based on c);
when the two-dimensional image fails to conform with the predetermined specification, triggering an adjustment of the dual beam system and,
when the two-dimensional image conforms with the predetermined specification, storing the two-dimensional image in a memory;
e) iteratively repeating a) through d) to store a plurality of two-dimensional images that conform with the predetermined specification in the memory; and
f) generating a three-dimensional volume image of the inspection volume using the plurality of two-dimensional images conforming with the predetermined specification,
wherein the adjustment of the dual beam system comprises at least one of:
adjusting the focused ion beam system to change a milling angle of the focused ion beam column relative to the semiconductor object, and
adjusting the focused ion beam system to change a milling range of the focused ion beam column.

2. The computer-implemented method of claim 1, further comprising:
forming alignment markers close to or within the inspection volume, or forming fiducials close to or within the inspection volume; and
writing the plurality of two-dimensional images into a common access memory.

3. The computer-implemented method of claim 1, further comprising: selecting or discarding at least one of the plurality of two-dimensional images.

4. The computer-implemented method of claim 1, further comprising: flagging image regions of the two-dimensional image which fails to be in conformity with the predetermined specification.

5. The computer-implemented method of claim 1, wherein evaluating the two-dimensional image comprises evaluating at least one image property selected from an image contrast, an image resolution, a presence of specific features within a 2D image, an accuracy of an image of a fiducial, or an accuracy of an image of an alignment marker.

6. The computer-implemented method of claim 1, further comprising triggering a repetition of the acquisition of the two-dimensional image when the two-dimensional image fails to be in conformity with the predetermined specification.

7. The computer-implemented method of claim 1, wherein generating the three dimensional volume image comprises receiving the plurality of two-dimensional images from a common access memory, and extracting a three dimensional inspection result from the two-dimensional images.

8. The computer-implemented method of claim 7, wherein generating the three-dimensional volume image comprises two dimensionally processing data to generate a standardized two dimensional image dataset from the plurality of two-dimensional images.

9. The computer-implemented method of claim 8, wherein generating the three dimensional volume image comprises fusing data to modify the standardized two dimensional image dataset.

10. The computer-implemented method of claim 8, further comprising: fusing the data to generate a three dimensional volume image dataset from the standardized two dimensional image dataset.

11. The computer-implemented method of claim 10, wherein generating the three-dimensional volume image comprises processing three dimensional data to determine at least one attribute of a three dimensional semiconductor object included within the three dimensional volume image dataset.

12. The computer-implemented method of claim 11, wherein processing the three dimensional data to determine the at least one attribute of the three dimensional semiconductor object included within the three dimensional volume image dataset comprises at least one of two dimensional intersection operations, three dimensional volume object operations, three dimensional object classification operations, or metrology operations.

13. The computer-implemented method of claim 11, wherein generating the three-dimensional volume image comprises extracting, displaying and storing of an inspection result from the at least one attribute.

14. The computer-implemented method of claim 13, wherein extracting, displaying and storing of an inspection result from the at least one attribute comprise at least one of data sorting operations, data analysis operations, or display operations.

15. The computer-implemented method of claim 1, comprising generating the three-dimensional volume image and at least part of acquiring the plurality of two-dimensional images at least partially in parallel.

16. The computer-implemented method of claim 1, wherein the plurality of two-dimensional images are acquired from an inspection volume of a semiconductor object, by a scanning electron microscope.

17. The computer implemented method of claim 1, wherein the adjustment comprises re-aligning the semiconductor object by using actuators to move the stage.

18. The computer implemented method of claim 1, comprising:
in response to completing the adjustment, determining that each of the plurality of two-dimensional images is in conformity with the predetermined specification by evaluating each two-dimensional image of the second plurality of two-dimensional images.

19. One or more machine-readable hardware storage devices comprising instructions that are executable by one or more processing devices to perform operations comprising the method of claim 1.

20. A system comprising:
one or more processing devices; and
one or more machine-readable hardware storage devices comprising instructions that are executable by the one or more processing devices to perform operations comprising the method of claim 1.

* * * * *